(12) United States Patent
Adachi

(10) Patent No.: US 7,425,794 B2
(45) Date of Patent: *Sep. 16, 2008

(54) DISPLAY DEVICE

(75) Inventor: Masaya Adachi, Ibaraki (JP)

(73) Assignee: Hitachi Displays, Ltd., Chiba (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/177,578

(22) Filed: Jul. 7, 2005

(65) Prior Publication Data

US 2006/0028146 A1    Feb. 9, 2006

Related U.S. Application Data

(63) Continuation of application No. 10/601,089, filed on Jun. 20, 2003, now Pat. No. 7,067,985.

(30) Foreign Application Priority Data

Jun. 21, 2002    (JP) .............................. 2002-181239

(51) Int. Cl.
*H01J 5/16*    (2006.01)
(52) U.S. Cl. ..................... 313/112; 313/113; 349/96; 349/115; 349/155; 315/169.3
(58) Field of Classification Search ............. 349/61, 349/69, 71, 96–99, 108, 113, 115, 155, 158; 313/504, 506, 509, 521, 112, 113, 512; 315/169.1–169.3; 345/76; 372/106
See application file for complete search history.

(56) References Cited

U.S. PATENT DOCUMENTS 4,772,885 A    9/1988    Uehara et al. ............... 349/71

(Continued)

FOREIGN PATENT DOCUMENTS

EP    97/12276    4/1997

(Continued)

OTHER PUBLICATIONS

Savko, et al., "A Circular Polarizer as a Means of Improving the Visibility of Electroluminescing Objects", The Optical Society of America, 1982 pp. 239-241.

(Continued)

*Primary Examiner*—Haissa Philogene
(74) *Attorney, Agent, or Firm*—Hogan & Hartson LLP

(57) ABSTRACT

A display device of the present invention has light-emitting devices making up a plurality of pixels placed in a matrix form. In the display device of the present invention, the light-emitting devices each possesses an emissive layer and a reflective element placed on the rear surface of the emissive layer; the emissive layer possesses at the said of the front side, a polarization separator which separates the light emitted from the emissive layer into two kinds of polarized components by the reflection and the transmission, and phase plate; the emissive layer substantially maintains the sate of the polarization of the light transmitted there-through; the reflective element at least reflects the circularly polarized light impinging in the vertical direction mainly as a circularly polarized light having a reverse helicity direction; and the polarization separator has a reflectance of the wavelength range from 520 nm to 600 nm smaller than a reflectance of range not more than 540 nm.

17 Claims, 21 Drawing Sheets

U.S. PATENT DOCUMENTS

| | | | | |
|---|---|---|---|---|
| 4,985,898 | A | * | 1/1991 | Furuya et al. ............... 372/106 |
| 5,048,933 | A | | 9/1991 | Asano ........................ 349/61 |
| 5,121,234 | A | | 6/1992 | Kucera ....................... 349/69 |
| 5,737,050 | A | * | 4/1998 | Takahara et al. ............ 349/122 |
| 5,748,369 | A | * | 5/1998 | Yokota ....................... 359/487 |
| 5,928,801 | A | | 7/1999 | Broer et al. ................. 428/690 |
| 5,999,243 | A | * | 12/1999 | Kameyama et al. ......... 349/185 |
| 6,252,640 | B1 | * | 6/2001 | Kim et al. ................... 349/96 |
| 6,300,989 | B1 | | 10/2001 | Iijima ......................... 349/96 |
| 6,307,604 | B1 | | 10/2001 | Hikmet et al. |
| 6,359,668 | B1 | | 3/2002 | Iijima et al. ................. 349/61 |
| 6,590,337 | B1 | | 7/2003 | Nishikawa et al. .......... 313/509 |
| 6,667,788 | B1 | | 12/2003 | Maruyama et al. .......... 349/115 |
| 6,717,358 | B1 | | 4/2004 | Liao et al. ................... 313/504 |
| 6,833,892 | B2 | * | 12/2004 | Kamijo ....................... 349/115 |
| 2002/0167630 | A1 | | 11/2002 | Fujieda et al. |
| 2003/0127656 | A1 | | 7/2003 | Aizawa et al. |
| 2006/0072047 | A1 | * | 4/2006 | Sekiguchi ................... 349/25 |

FOREIGN PATENT DOCUMENTS

| | | |
|---|---|---|
| GB | 1 389 737 | 5/1972 |
| JP | 63-035765 | 2/1988 |
| JP | 05-098421 | 4/1993 |
| JP | 06235900 A | 8/1994 |
| JP | 09-127885 | 5/1997 |
| JP | 11-045058 | 2/1999 |
| JP | 11045058 A | 2/1999 |
| JP | 2000-356769 | 12/2000 |
| JP | 2001-244068 | 9/2001 |
| JP | 2001-244080 | 9/2001 |
| JP | 2001-311826 | 11/2001 |
| JP | 2001-357979 | 12/2001 |
| JP | 2002270021 A | 9/2002 |
| JP | 2003-115383 | 4/2003 |
| JP | 2003186413 A | 7/2003 |

OTHER PUBLICATIONS

Miyaguchi, et al., "Organic LED Full-Color Passive-Matrix Display", Journal of the SID, 1999 pp. 221-225.

Shimoda, et al., "Multicolor Pixel Patterning of Light-Emitting Polymers by ink-Jet Printing", Seiko Epson Corporation, 1999.

Japanese language office action for corresponding Japanese application No. 2002-181239 lists the references above.

* cited by examiner

DISPLAY DEVICE

This is a continuation of application Ser. No. 10/601,089 filed Jun. 20, 2003 now U.S. Pat. No. 7,067,985, which application is hereby incorporated by reference in its entirety.

BACKGROUND OF THE INVENTION

1. Field of the Invention

The present invention relates to a display device, which controls the operations of light emitting devices for display. More particularly, the invention relates to a technique available for light emitting devices such as organic light emitting diodes comprising a emissive layer having a reflective element provided on the rear surface thereof and a display device possessing such light emitting devices.

2. Description of the Related Arts

Organic light emitting diodes elements (devices) which emits a light by injecting holes and electrons into a emissive layer to thereby convert an electric energy into a light energy. Such types of display devices (hereinafter sometimes abbreviated as "OLED display devices"), which is emission type ones, have a characterized to have a thin type and a light weight unlike non-emissive type ones represented by liquid crystal devices. Furthermore, OLED display devices are characterized to have a wide viewing angle and have a rapid response time.

FIG. 22 is a schematic cross-sectional view showing one example of the conventional OLED display device. The OLED display device shown in this figure is composed of a transparent electrode 200 having a function of an anode, a hole transporting layer 102, an emissive layer 100, an electron transporting layer 101, and a reflective electrode 300 comprising a light reflective metal serving as a cathode deposited on a transparent substrate 400 in this order. When direct current voltage is applied between the transparent electrode 200 and the reflective electrode 300, the holes, which have been injected from the transparent electrode 200 arrive at the emissive layer 100 via the hole transporting layer 102 and electrons injected from the reflective electrode 300 arrive at the emissive layer 100 via the hole transporting layer 101, where the electrons and holes are recombined and the emission is brought about there-from.

Amongst lights emitted from the emissive layer 100, the lights 1000 directing towards the transparent electrode 200 are passed through the transparent electrode 200 and then are emitted from the transparent substrate 400. The lights 1001 directing towards the reflective electrode 300 are reflected at the reflective electrode 300, then are passed through the emissive layer 100, the transparent electrode 200 and the like, and are similarly emitted from the transparent substrate 400. Consequently, in such a type of OLED display device, it is important for obtaining a bright image to use an electrode having a high reflectance as the reflective electrode whereby the quantities of the lights emitted from the side of the transparent electrode is increased.

In such a configuration as described above, since the reflective electrode is in a state of mirror having a high reflectance when the OLED display device is in the state where it emits no light, under a bright environment, the image quality is deteriorated due to the fact that surrounding backgrounds are reflected in the reflective electrode and the image which should be displayed in black is not becomes dark, reducing a contrast ratio. These lead to problems, which should be solved. As one means for solving such problems, a configuration has been put into practical use in which a circular polarizer plate 800 is placed at the light emitting side of the transparent electrode 400. The circular polarizer plate 800 is composed of a polarizer plate 600 and a phase plate 700 serving as a quarter wave plate. The circular polarizer plate 800 is acted as follows:

An ambient light entering in the OLED display device from the circumference is an un-polarized light as a rule. Upon passing the ambient light through the polarizer plate 600, a linearly polarized light is transmitted through the polarizer plate 600, and a linearly polarized light perpendicular to the light just mentioned is absorbed thereon. The linearly polarized light having been transmitted through the polarizer plate 600 has an influence of the phase plate 700 to be circularly polarized light (in this case, for example, dextrorotatory circularly polarized light). Upon being reflected at the reflective electrode 300, the circularly polarized light having been passed through the phase plate 700 becomes a circularly polarized light whose helicity direction is reversed (levorotatory circularly polarized light). The light 2000R having been reflected at the reflective electrode 600 again enters in the phase plate 700, at which it has an influence of the phase plate 700 at the time of passing through the phase plate 700 to be converted into a linearly polarized light. In this case, the linearly polarized light having been converted is absorbed on the polarizer plate 600 and, thus, it is not returned to the external system. Specifically, the reflection of the ambient light on the reflective electrode 300 is reduced to darken the displaying of a black image, whereby the contrast ratio is remarkably improved. Such a construction is described, for example, in Japanese Patent Laid-Open Publication Nos. 8-509834 and 9-127885, which are incorporated herein by references. However, the OLED display device having a circular polarizer plate is disadvantageous in the fact that the displaying of the images are darkened since parts of lights emitting from the emissive layer are absorbed on the circular polarizer plate. This is due to the fact that since the lights emitting from the emissive layer are generally un-polarized lights and, thus, approximately half of the light is are absorbed on the polarizer plate making up the circular polarizer plate.

As a method for decreasing the lights absorbed on the polarizer plate to realize bright displaying, an OLED display device has been suggested, which has means for selectively reflecting circular polarized light comprising a cholesteric liquid crystal layer disposed between a quarter wave plate and a emissive layer. Such a construction is disclosed, for example, in Japanese Patent Laid-Open Publication Nos. 2001-311826 and 2001-357979, which are incorporated herein by references. In this case, the lights emitting from the emissive layer enter in the cholesteric liquid crystal layer at which a specific circularly polarized light component is reflected, and a circularly polarized light component having a helicity direction different from that of the former is transmitted. When being passed through the quarter wave plate, the light having been transmitted through the cholesteric liquid crystal layer has an influence of the quarter wave plate to be converted into a linearly polarized light, which is transmitted through the polarizer plate.

On the other hand, the light reflected at the cholesteric liquid crystal layer is returned to the emissive layer and then reflected at the reflective electrode, at the time of this reflection, it becomes a circularly polarized light having a reverse helicity direction. The light reflected at the reflective electrode again enters in the cholesteric liquid crystal layer, at this time, it is passed there-through and has an influence of the quarter wave plate to thereby be converted into a linearly polarized light, which is transmitted through the polarizer plate. Specifically, amongst the lights emitting from the emissive layer, the lights which are polarized light to be absorbed on the polarizer plate are reflected at the cholesteric liquid crystal layer, before they are absorbed on the polarizer plate, whereby they are recycled. This obtains bright displaying of the images.

In the technique just mentioned, since lights which emit from the emissive layer and are transmitted through the polarizer plate, are increased, much more bright displaying of the image can be obtained in comparison with the OLED display device only having a circularly polarizer plate. However, in the case of using the later OLED display device under a bright ambient condition, there arises the following problems associated with ambient lights, which will enter in the later OLED display device: The ambient lights entering in the OLED display device are generally un-polarized lights and at least halves of them are adsorbed on the polarizer plate, when they are passed through the polarizer plate. When being transmitted through the quarter wave plate, the lights having been passed through the quarter wave plate have an influence thereof to be circularly polarized lights (for example, dextrorotatory circularly polarized light), and is transmitted through the cholesteric liquid crystal layer. Upon transmitting the lights having been passed through the cholesteric liquid crystal layer through the emissive layer while substantially maintaining their polarized states, and at the time of the reflection at the reflective electrode, they becomes circularly polarized lights whose helicity direction is reversed (levorotatory circularly polarized lights), and then reflected again when entering in the cholesteric liquid crystal layer.

Since the lights reflected at the cholesteric liquid crystal layer again reflected at the reflective electrode to be a circularly polarized light having a reverse helicity direction (dextrorotatory circularly polarized light), the light at this time are transmitted through the cholesteric liquid crystal layer, passed through the quarter wave plate and the polarizer plate, whereby they exit out of the OLED display device. This means that an unnecessary reflection of the ambient light is increased by the arrangement of the cholesteric liquid crystal layer and, thus, indicates that the black image cannot be displayed in a sufficient manner under a bright condition, leading to markedly decreasing of the contrast ratio.

According to these prior arts described above, there is a description that in order to realize a wide wavelength range of selective reflection within the visible wavelength range, a plurality of cholesteric liquid crystal layers each having a different helical pitch are deposited. As one embodiment of the prior art, the central wavelength of the selective reflection at the cholesteric liquid crystal layers is set to be 550 nm, which is a high relative luminous efficiency in a photopic vision. These conditions are the conditions where the unnecessary reflection of the ambient light brought about by placing the cholesteric liquid crystal layers becomes large, and thus, lead to a remarkable decrease in the contrast ratio under a bright condition. Specifically, in the prior art, there is no description for the problem for increasing the reflection of the ambient light, which occurs in the case of the display device having the polarization separator such as the cholesteric liquid crystal layers, and no deal has been made.

As one method for realizing a full color display device using an organic light-emitting diode, a method in which pixels corresponding to three primary colors (red (R), green (G), and blue (B)) are directly patterned has been suggested. This method can be expected to realize a high efficiency by forming the pixels for respective colors under the optimum conditions. However, since the existing organic light-emitting diodes have the wavelength of the light emission deviating from the desirable wavelength or since the distribution of the wavelength for light emission is wide and gentle, no sufficient color reproduction can be obtained.

Also, since the luminous efficiency (lm/W) is differed in the colors, the power consumption for displaying white becomes large. At the present situation, the organic light-emitting diode for green light emission has the highest luminous efficiency, but since the balance of chromaticity of each color is bad, it is required that the luminous intensity of the organic light-emitting diode for green light emission, which has a high luminous efficiency is relatively decreased, and the luminous intensities of the organic light-emitting diodes for red and blue light emission are increased, leading to decreased total efficiency.

The present invention has been done in light of the above situation, and an object of the present invention is to provide a display device which can realize bright display by effectively contributing the light emitted from the organic light-emitting diode to display, and which can realize display with a high contrast even under a bright condition by decreasing the reflection of the ambient light. Also, an object of the present invention is to provide a color display device, which shortens the difference of the power in colors and enhances the efficiency. Another objects will be apparent from the following description.

SUMMARY OF THE INVENTION

A display device of the present invention has light-emitting devices making up a plurality of pixels placed in a matrix form. In the display device of the present invention, the light-emitting devices each possesses an emissive layer and a reflective element placed on the rear surface of the emissive layer; the emissive layer possesses at the front side thereof, a polarization separator which separates the light emitted from the emissive layer into two kinds of polarized components by the reflection and the transmission, and phase plate; the emissive layer substantially maintains the sate of the polarization of the light transmitted there-through; the reflective element at least reflects the circularly polarized light impinging in the vertical direction mainly as a circularly polarized light having a reverse helicity direction; and the polarization separator has a reflectance of the wavelength range from 520 nm to 600 nm smaller than a reflectance of range not more than 510 nm.

The polarization separator preferably has a reflection of a light having a wavelength corresponding to blue higher than light having a wavelength other than blue. Also, the polarization separator preferably has a reflectance at a wavelength range of not more than 510 nm higher than that at other visible wavelength range.

The polarization separator preferably comprises a cholesteric liquid crystal layer, and the phase plate comprises a quarter wave plate, and the polarization separator, the phase plate, and the polarizer plate are provided from the side of the emissive layer in this order.

Also, the polarization separator preferably comprises a cholesteric liquid crystal layer substantially comprising one kind of a helical pitch, and the central wavelength of the selective reflection is between 400 nm to 490 nm.

In addition, it is preferred that the polarization separator is selectively formed on the position corresponding to the light-emitting device for blue light emission.

Also, it is preferred that the polarization separator comprises a cholesteric liquid crystal layer substantially comprising one kind of a helical pitch, the central wavelength of the selective reflection is between 400 nm to 490 nm, and the peak wavelength of the reflection other than the main reflection range is between 510 nm to 600 nm.

In the display device of the present invention, an antireflection member for at least decreasing the reflection of the light having the main wavelength range reflected by the polarization separator may be provided on a non-emissive area of the pixel composed of the light-emitting device.

Also, it is preferred that the polarization separator comprises a plurality of cholesteric liquid crystal layers each having a different helical pitch, and the central wavelength of the selective reflection is between 400 nm to 490 nm.

The polarization separator may comprise a plurality of cholesteric liquid crystal layers each having a different helical pitch, and a cholesteric liquid crystal layer having the central wavelength of the selective reflection between 400 nm to 490 nm amongst the plurality of cholesteric liquid crystal layers has a thickness larger than the thickness of the layer, which has the maximum reflectance, the remaining cholesteric liquid crystal layers have a thickness smaller than the thickness of the layer, which has the maximum reflectance.

In this embodiment, the plurality of cholesteric liquid crystal layers making up the polarization separator may be stacked.

In a preferred embodiment of the display device according to the present invention, the plurality of cholesteric liquid crystal layers making up the polarization separator are patterned in the direction of the inner surface of the substrate;

a cholesteric liquid crystal layer having a wavelength range of the selective reflection corresponding to a blue color is placed on the position corresponding to the light-emitting device which emits a blue color;

a cholesteric liquid crystal layer having a wavelength range of the selective reflection corresponding to a green color is placed on the position corresponding to the light-emitting device which emits a green color; and a cholesteric liquid crystal layer having a wavelength range of the selective reflection corresponding to a red color is placed on the position corresponding to the light-emitting device which emits a red color.

Also, the polarization separator may comprise a cholesteric liquid crystal layer whose helical pitch is continuously changed, and the wavelength range which can obtain the maximum selective reflection by the cholesteric liquid crystal layer is not more than 510 nm.

In another preferred embodiment of the display device of the present invention, the polarization separator is a linear polarization separator, which reflects a linearly polarized light having a prescribed wavelength range, and transmits lights other than the linearly polarized light having a prescribed wavelength range;

the phase plate comprises a quarter wave plate, and the polarization separator, the phase plate, and the polarizer plate are provided from the side of the emissive layer in this order.

In still another preferred embodiment of the display device of the present invention, the light-emitting devices comprises an organic light-emitting diodes having an electrode also serving as the reflective element, an emissive layer comprising organic thin films, and an optional transparent electrode stacked with each other.

Furthermore, in the display device of the present invention, a space sealed with a gas may be provided between the protective layer and the polarization separator, and the distance between the space and the emissive layer is quarter the wavelength of the light emitted from the emissive layer or less.

In another aspect of the present invention, there is provided a display device comprising a first substrate having a reflective electrode, an organic emissive layer and an opposite electrode within the inner surface thereof in this order to make up a plurality of pixels placed in a matrix form, and a second substrate having a polarization separator within the inner surface thereof opposite the inner surface of the first substrate and having a phase plate and a polarizer plate on the outer surface thereof in this order, the polarization separator comprising cholesteric liquid crystal layer, and the phase plate comprising a quarter wave plate.

In still another aspect of the present invention, there is provided a display device comprising a substrate having a reflective electrode, an organic emissive layer and an opposite electrode within the inner surface thereof in this order to make up a plurality of pixels placed in a matrix form and having a polarization separator, a phase plate and a polarizer plate on the outer surface thereof in this order, the polarization separator comprising cholesteric liquid crystal layer, and the phase plate comprising a quarter wave plate.

In these aspects, an active matrix elements for selecting and driving the pixel may be provided within the inner surface of the (first) substrate.

DESCRIPTION OF THE PREFERRED EMBODIMENTS

Figure 1:
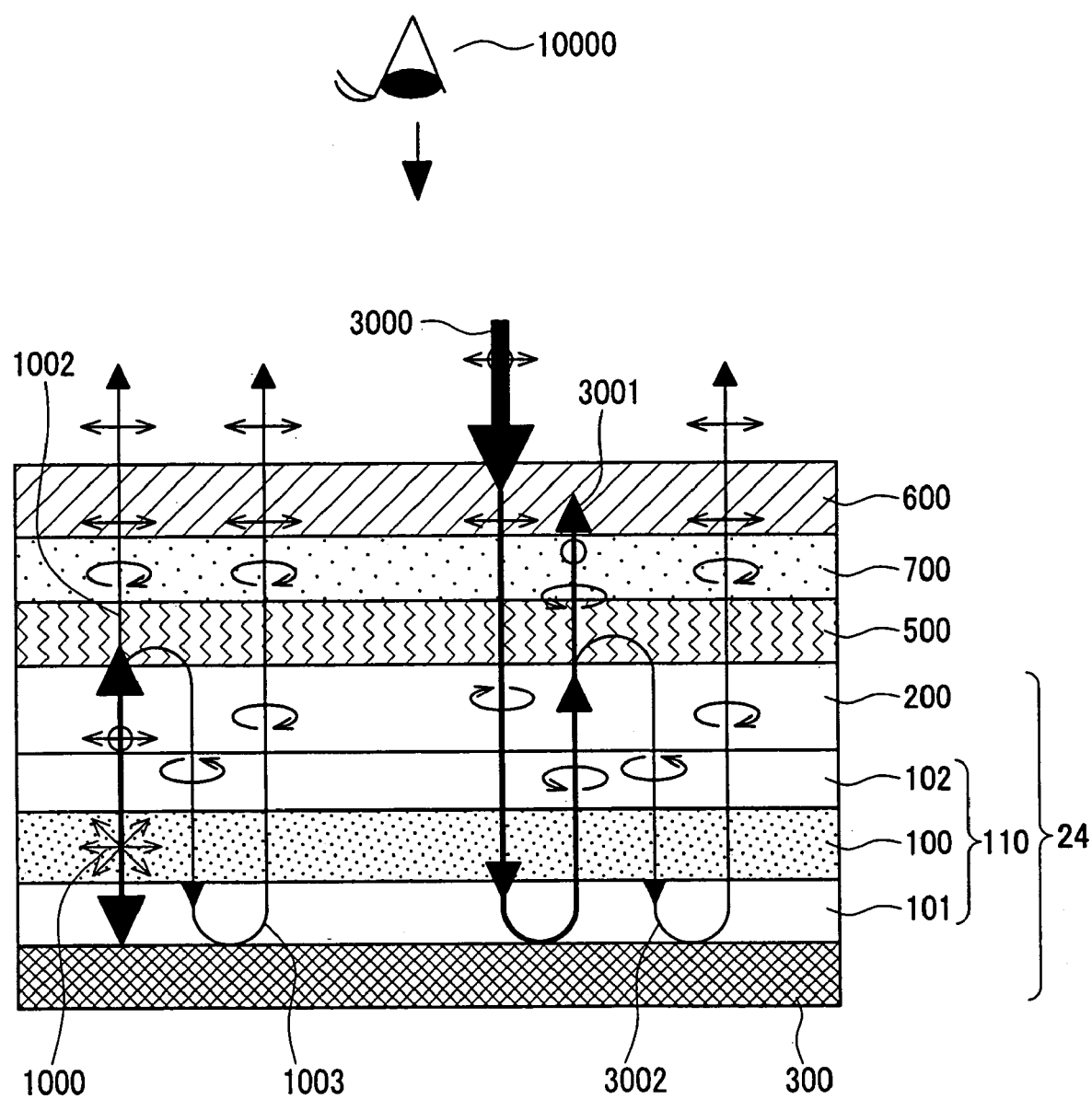
FIG. 1 is a partially cross-sectional view showing a schematic configuration for explaining the basic configuration and the operation principal of the display device according to the present invention.
Figure 2:
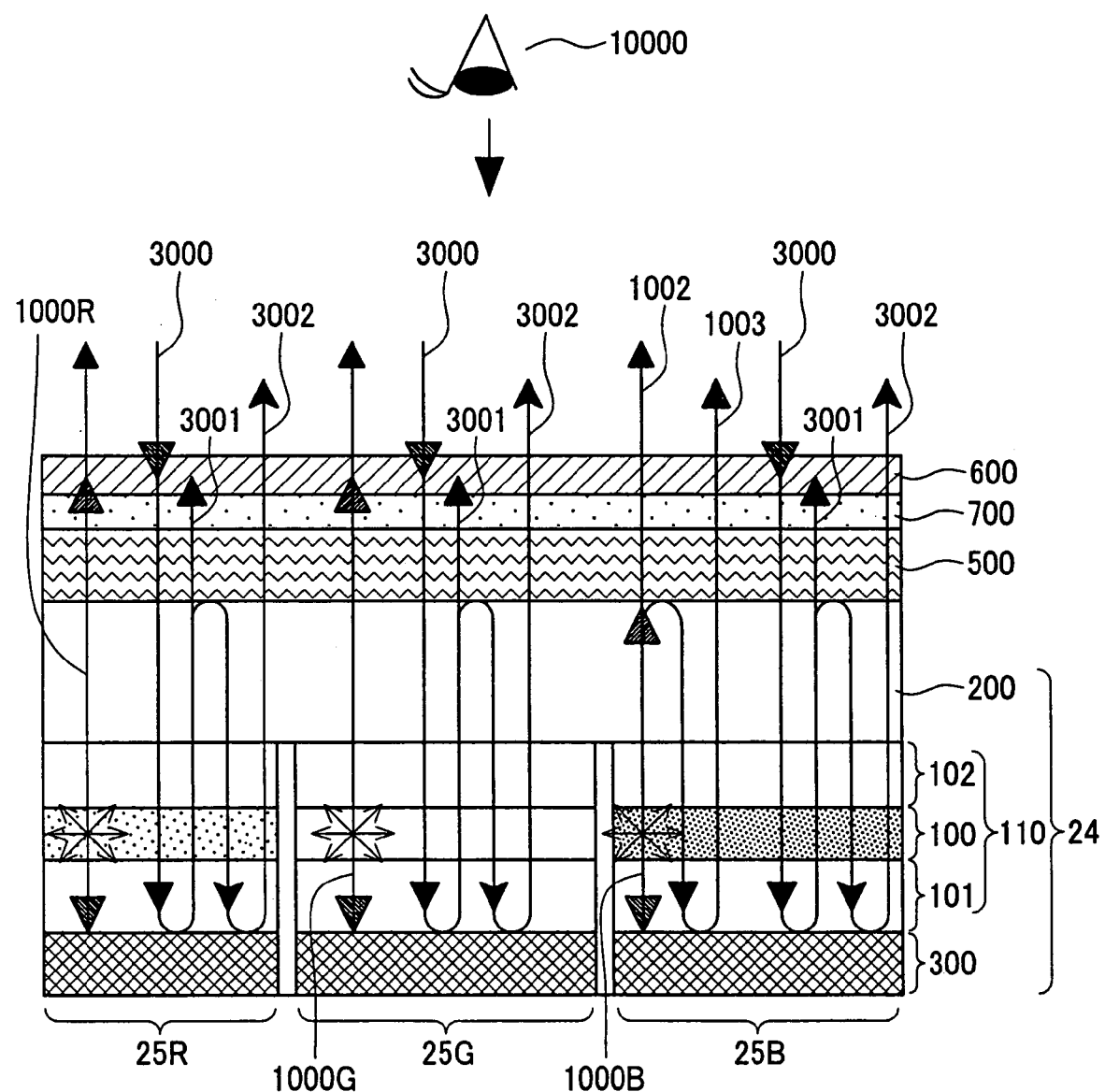
FIG. 2 is a partially cross-sectional view showing a schematic configuration for explaining the basic configuration and the operation principal of the display device according to the present invention, which displays full color images.

The present invention will now be described by referring to the drawings. FIG. 1 is a partially cross-sectional view showing a schematic configuration for explaining the basic configuration and the operation principal of the display device according to the present invention. FIG. 2 is a partially cross-sectional view showing a schematic configuration for explaining the basic configuration and the operation principal of the display device according to the present invention, which displays full color images.

First, referring to FIG. 1, the basic configuration and the operation principal of the display device according to the present invention will be described.

A light emitting device part according to the display device of the present invention is composed of an organic light emitting diode 24 comprising a transparent electrode 200 serving as an anode formed on the substrate (not shown), a reflective electrode 300 serving as a cathode and as a specular reflector, an organic layer 110 formed between the anode and the cathode, and a polarization separator 500, a phase plate 700, and a polarizer plate 600 disposed in this order from the front surface side of the light emitting diode 24 (the side of the transparent electrode 200).

The organic layer 110 making up the organic light emitting diode 24 may be a laminate comprising, from the cathode side (the side reflective electrode 300) to the anode (the side of the transparent electrode 200), an electron-transporting layer 101, an emissive layer 100, and a hole-transporting layer 102. The emissive layer 100 and the electron-transporting layer 101 may be a mono-layer by utilizing a material which can make up both layers. As the configuration of the light emitting diode, one which has a configuration of an anode buffer layer and/or a hole injecting layer may be used. An electrode material, which has a high work function and which is a transparent, may be utilized as the anode (transparent electrode 200, and, for example, ITO (indium tin oxide) may be suitably used. Also, IZO (indium zinc oxide) may be utilized.

As the reflective electrode 300 which is the cathode 300, Al, Mg, Mg—Al alloy, Al—Li alloy, and the like which have a low work function, may be used. The sole use of Al requires a high driving voltage and leads to a shortened life, and, thus, a very thin Li compound such as lithium oxide $Li_2O$ or lithium fluoride LiF is inserted between the Al film and the organic layer to obtain characteristics equivalent to Al—Li alloy. Also, it is possible to dope a portion of the organic layer in contact with the cathode with a highly reactive metal such as lithium or strontium to lower the driving voltage. From the viewpoint of the utilization efficiency of the light emitting from the emissive layer, the reflective electrode 300 is preferably made of a material having a high reflectivity. Furthermore, from the reason, which will be described later on, the reflective electrode 300 preferably possesses a specular reflector, which at least reflects a circularly polarized light impinging from the vertical direction as a circularly polarized light having a reverse helicity direction from the viewpoints of the decreasing of the reflection of the ambient light and of the utilization efficiency of the light emitting from the emissive layer.

As the material of the organic layer 110, a material is used, which emits a light on a desired color when a prescribed voltage is applied between the anode (transparent electrode 200) and the cathode (reflective electrode 300). Examples of red light-emitting materials which may be used for the hole transporting layer 102, include, but are not restricted to, alpha-NPD (N,N'-di(alpha-naphtyl)-N,N'-diphenyl-1,1'-bi-siphenyl-4,4'-diamine)) and triphenyldiamine derivatives such as TPD (N,N'-bis(3-methylphenyl)-1,1'-biphenyl-4,4'-diamine. An Example of red light emitting materials which may be used for the electron-transporting layer (used both for the electron-transporting layer and the emissive layer) includes, but is not restricted to, Alq3 (tris (8-quinolinolate)) aluminum having DCM-1 (4-(dicyanomethylene)-2-methyl-6-(p-dimethylaminostyryl)-2-4H-pyran dispersed therein.

Examples of green light-emitting materials which may be used for the hole transporting layer 102, include, but are not restricted to, alpha-NPD and triphenyldiamine derivatives such as TPD, and examples of green light emitting materials which may be used for the electron-transporting layer (used both for the electron-transporting layer and the emissive layer) include, but is not restricted to, Alq, Bebq (bis (8-hydroxyquinolinate)-beryllium and Alq having been doped with quinacridone.

Examples of blue light emitting materials which may be used for the hole transporting layer 102, include, but are not restricted to, alpha-NPD and triphenyldiamine derivatives such as TPD, examples of blue light emitting materials which may be used for the emissive layer 100 include, but are not restricted to, DPVB1 (4,4'-bis(2,2-diphenylvinyl)biphenyl) or a mixture of DPVBi with BczVBi (4,4'-bis(2-carbazolevi-nylene)biphenyl) doped materials comprising distyrylal-lylene derivatives as hosts and distyrylamine derivatives as guest. Alq3 may be used as the material for the electron-transporting layer 101 for the blue light emitting material. Zn(oxz)2 (zinc complex of 2-(o-hydroxylphenyl)-benzox-azple) may be used as the blue light emitting materials for the electron-transporting layer (used both for the electron-transporting layer and the emissive layer).

On the other hand, in addition to a low molecular material, polymeric material may also be used. For example, a stacked layer comprising PEDT/PSS (a mixed layer of polyethylene dioxythiophene and polystyrene sulphonate)and PPV (poly (p-phenylene vinylene) can be used as the hole-transporting layer 102 and the emissive layer 100. In this case, although no electron-transporting layer is provided, it may be provided as occasion may demand.

The green light emission is realized by formulation of green ink into PPV, the emitting of the red light is realized by the formation of green ink together with Rhodamine 101 as a red light emitting dopant. As a emissive layer, which emits a blue light can be used F8 (poly(dioctylfluorene). Also, as the polymeric materials other than those described previously, pigment-containing polymers such as PVK (polyvinyl carbazole) maybe used. In any case, each layer making up the organic layer 110 is thin, which is approximately severl ten nanometers, the polarization states of the lights which are passed through each layer are substantially maintained.

In the organic light-emitting diode 24 configured as described above, a direct current power source is connected to the transparent electrode 200, which is the anode, and the reflective electrode 300, which is the cathode, and when a direct current voltage is applied between the transparent electrode 200 and the reflective electrode 300, the holes injected from the transparent electrode 200 arrive at the emissive layer via the hole-transporting layer 102 and the electrons injected from the reflective electrode 300 arrive at the emissive layer via the electron-transporting layer 101, respectively, to recombine the electron-hole whereby a light having a prescribed wavelength is emitted.

Opposite the organic layer 110, on the transparent electrode 200 are stacked a polarization separator 500, a phase plate 700, and a polarizer plate 600 are stacked in this order. The polarization separator 500 has a function that a light having a prescribed wavelength range is separated into two light components having complementary states of the polarization by the reflection and the transmission. As the polarization separator 500 intended herein is suitably a cholesteric liquid crystal layer.

Since the cholesteric liquid crystal layer has specific optical characteristics based upon a helical molecular alignment, the lights impinging parallel to the helical axis show selective reflection that at the wavelength corresponding to the pitch of the cholesteric helix, one circularly polarized light component having a first circular helicity is reflected, and the other is transmitted. When the central wavelength of the selective reflection through the cholesteric liquid crystal layer is taken as $\lambda_0$ and the wavelength range thereof is taken as $\Delta\lambda$, they are represented by the following formulae (1) and (2)

$$\lambda_0 = n_m \cdot p \quad (1)$$

$$\Delta\lambda = \Delta n \cdot p \quad (2)$$

where p is a helical pitch of the cholesteric liquid crystal layer, $n_m$ is an average refractive index. When $n_e$ and $n_0$ are the extraordinary and ordinary refractive indices, respectively, $n_m$ and $\Delta n$ are represented by the following formulae (3) and (4)

$$n_m = \sqrt{((n_e^2 + n_0^2)/2)} \quad (3)$$

$$\Delta n = n_e - n_0 \quad (4)$$

As the cholesteric liquid crystal layer, preference is given to use a polymerized cholesteric liquid crystal film. For example, a film produced, for example, by forming an alignment layer such as polyvinyl alcohol on a triacetyl cellulose film to subject an alignment treatment, and forming a cholesteric liquid crystal film thereon.

Here, when the display device which can display full colors is realized, the wavelength of the light emitted from the organic light emitting diode should correspond to the primary colors, red, green and blue per each pixel. Specifically, as outlined in FIG. 2, the organic layer 110 is configured to be patterned light emitting organic layers for each primary colors, i.e., a red light emitting organic layer, a green light emitting organic layer, and a blue light emitting organic layer corresponding to a red light emitting portion 25R, a green light emitting portion 25G and a blue light emitting portion 25B, and the peaks of the emitting light of the organic light emitting diode 24 are differed depending upon pixels. In contrast, the wavelength range of the selective reflection at the cholesteric liquid crystal layer or the central wavelength $\lambda_0$ of the selective reflection corresponds to the light emitting wavelength range or the peak wavelength of the light emission of the organic light emitting diode 24 of the blue light emitting pixel.

In the case where the light emitting from the organic light emitting diode of the blue light emitting pixel is not enough for blue light, it is desirable that the wavelength range of the selective reflection of the cholesteric liquid crystal layer and the central wavelength of the selective reflection are set at the shorter wavelength range than those of the peak wavelength of the light emission from the organic light emitting diode and wavelength range of the light emission. Specifically, the central wavelength of the selective reflection is preferably from 400 nm to 490 nm, and preferably from 420 nm to 480 nm, and the wavelength range of main selective reflection is desirably not more than 510 nm. As described fully later on, this is for the purpose of minimizing the reflection of the ambient light, and for effectively utilizing an effective light as a blue light to increase the color purity of the blue whereby the total efficiency of the display device is improved.

Figure 3:
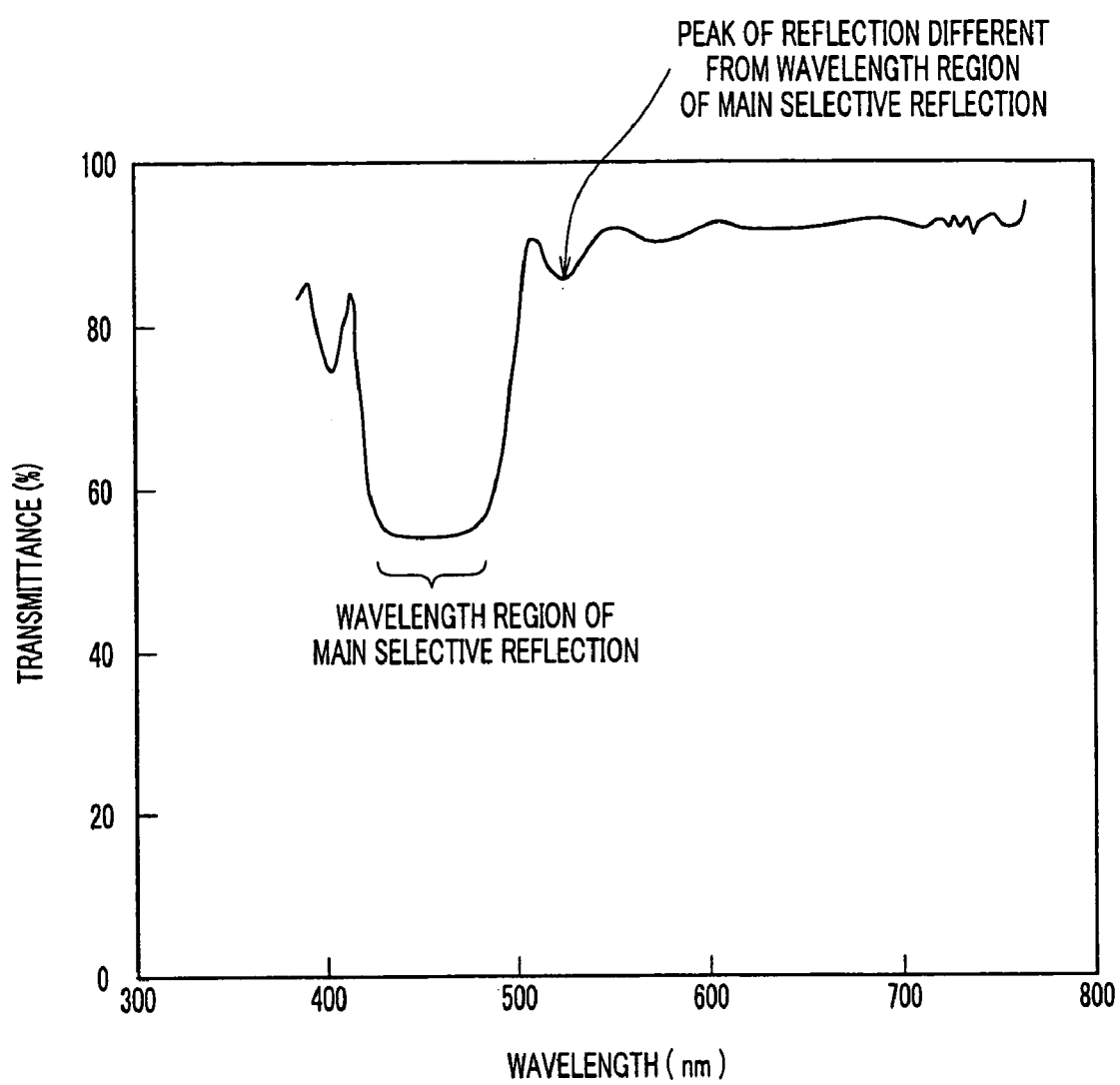
FIG. 3 is a drawing showing one example of a spectral transmittance of the cholesteric liquid crystal layer making up the polarization separator.

FIG. 3 is a drawing showing one example of a spectral transmittance of the cholesteric liquid crystal layer making up the polarization separator, and specifically shows one example of spectral transmittance of the cholesteric liquid crystal layer having a selective reflection corresponding to the blue light as described above. FIG. 3 shows the wavelength-dependency of the transmittance when an un-polarized light enters in the cholesteric liquid crystal layer. The phase plate 700 and the polarizer plate 600 correspond to those making up the circularly polarized plate in the prior art. Specifically, the polarizer plate 600 transmits a specific linearly polarized light amongst the lights passing there-through, and absorbs a linearly polarized light perpendicular to the former. The phase plate 700 is made up of the material serving as a quarter wave plate which converts the linearly polarized light passing through the polarizer plate 600 into a substantially circularly polarized light.

The polarizer plate 600 which can be used is one which is prepared by applying protective layers made of triacetyl cellulose on both surfaces of a film having a polarization function imparted by absorbing iodine on a stretched polyvinyl alcohol film. As the phase plate 700, a transparent, uniaxial stretched polymer films such as made of polyvinyl alcohol, polycarbonate, polysulfone, polystyrene, and polyarylate can be used. Since the polymer film making up the phase plate 700 has wavelength-dependency of the refractive index as a rule, no sufficient performance can sometimes be obtained, when the phase plate 700 is made of one polymer film with respect to lights having a wide wavelength range. For this reason, retardation films each having a different phase difference may be stacked with slanting their slow axes to constitute a phase plate serving as a quarter wave plate within a wide wavelength range.

The direction of the slow axis of the phase plate 700 is decided so that the circularly polarized light passing through the polarizer plate 600 and the phase plate 700 becomes a circularly polarized light having a reverse the helicity direction (e.g., dextrorotatory circularly polarized light) to the circularly polarized light which is selectively reflected by the cholesteric liquid crystal layer making up the polarization separator 500 (levorotatory circularly polarized light).

Subsequently, the operation of the display device according to the present invention will now be described by referring to FIG. 1 and FIG. 2. When a direct current power source is connected to the transparent electrode 200 and the reflective electrode 300, and current is run, a light with a prescribed wavelength is emitted from the emissive layer 100. The light 1000 (1000R, 1000 G, and 1000 B in FIG. 2) emitted from the emissive layer 100 is directed towards the transparent electrode 200 directly or after it is reflected at the reflective electrode 300, it is transmitted through the transparent electrode 200 and then enters in the polarization separator 500. At this time, since the light emitted from the emissive layer 100 is un-polarized, amongst the light components, a circularly polarized light component having one helicity direction (for example, levorotatory circularly polarized light) corresponding to the wavelength range of the selective reflection at the cholesteric liquid crystal layer is reflected, and the components other than the former component are transmitted.

Specifically, in the blue light corresponding to the wavelength range of the selective reflection at the cholesteric liquid crystal layer 500, a circularly polarized light component having one helicity direction (for example, levorotatory circularly polarized light) is reflected, and a circularly polarized light component having reverse helicity direction to the former (dextrorotatory circularly polarized light) is transmitted. Also, almost all parts of the red light and the green light are transmitted through the cholesteric liquid crystal layer 500. Amongst the light 1002 having been transmitted through the polarization separatir 500, the light corresponding to the wavelength range of the selective reflection at the cholesteric liquid crystal layer is converted into a linearly polarized light, which is transmitted through the polarization separator 600, by the action of the polarizer plate 600, and the light transmitted through the polarizer plate 600 is directed towards the side of the viewer 10000. Also, amongst the light 1002, approximately half of the light not corresponding to the wavelength range of the selective reflection at the cholesteric liquid crystal layer is absorbed on the polarizer plate 600, and the remaining half is directed towards the side of the viewer 10000.

On the other hand, the light 1003 reflected at the polarization separator 500 is transmitted through the emissive layer and the like while substantially maintaining its polarization states, then reflected at the reflective electrode 300, and is again directed towards the polarization separator 500. At the time of the reflection at the reflective electrode 300, the helicity direction of the light 1003 is reserved (i.e., the light 1003 becomes a circularly polarized light having a reverse helicity direction such as a dextrorotatory circularly polarized light) and, thus, at this time, the light 1003 is transmitted through the polarization separator 500. The light 1003 transmitted through the polarization separator 500 is converted into a linearly polarized light, which is transmitted through the polarizer plate 600 by the action of the phase plate 700, and then transmitted through the polarizer plate 600 to be directed towards the side of the viewer 10000.

Consequently, amongst the light emitting from the emissive layer 100, almost all parts of the light corresponding to the wavelength range of the selective reflection by the cholesteric liquid crystal layer are directed towards the side of the viewer 10000 without being absorbed on the polarizer plate 600. Specifically, amongst the lights which are absorbed on the polarizer plate to be useless in conventional, the light corresponding to the blue color, which is corresponds to the wavelength range of the selective reflection by the cholesteric liquid crystal layer is reflected at the polarization separator (cholesteric liquid crystal layer) can be reused, leading to the advantage in terms of being brightness.

Subsequently, the ambient light, which enters in the display device from the circumferences under bright conditions will now be described. The ambient light 3000 entering in the display device from the circumferences is generally un-polarized. Amongst the ambient light 3000, when being passed through the polarizer plate 600, a prescribed linearly polarized light is absorbed, and the linearly polarized light perpendicular thereto is transmitted. The linearly polarized light having been transmitted through polarizer plate 600, by the action of the phase plate 700 to be a circularly polarized light (for example, dextrorotatory circularly polarized light) The light having been passed through the phase plate 700 is transmitted through the polarization separator 500, and becomes a circularly polarized light having a reverse helicity direction (levorotatory circularly polarized light) as a result at the time of being reflected at the reflective electrode 300. The light reflected at the reflective electrode 300 enters in the polarization separator 500 at which a light 3001 having a wavelength other than the wavelength range of the selective reflection at the cholesteric liquid crystal layer making up the polarization separator 500 is transmitted through the polarization separator 500 as is, the light having a wavelength corresponding to the wavelength range of the selective reflection at the cholesteric liquid crystal layer is reflected. The light 3001 having been transmitted through the polarization separator 500 becomes a linearly polarized light which is absorbed on the polarizer plate 600 by the action of the polarizer plate 600, and is absorbed on the phase plate 700; thus, it is not returned to the external display device.

On the other hand, the light 3002 reflected at the polarization separator 500 is reflected at the reflective electrode 300 and, is again directed to the polarization separator 500. At the time of reflection at the reflective electrode 300, the light 3002 becomes a circularly polarized light whose helicity direction of the light is reversed and, thus, the light 3002 is transmitted through the polarization separator 500 at this time. The light 3002 having been transmitted through the polarization separator 500 is converted into a linearly polarized light which is transmitted through the polarizer plate 600, by the action of the phase plate 700, and is transmitted through the polarizer plate 600 to be directed towards the side of the viewer 10000. Specifically, at least half of the ambient light 300 entering in the display device is first absorbed on the polarizer plate 600. The light having been transmitted through the polarizer plate 600 is reflected at the reflective electrode 300 and then enters in the polarization separator 500, and the light 3001, which is transmitted through the polarization separator 500, is absorbed on the polarizer plate 600. For this reason, the light returning to the external display device is only slight amount of the light 3002 corresponding to the wavelength range of the selective reflection at the cholesteric liquid crystal layer.

Figure 4:
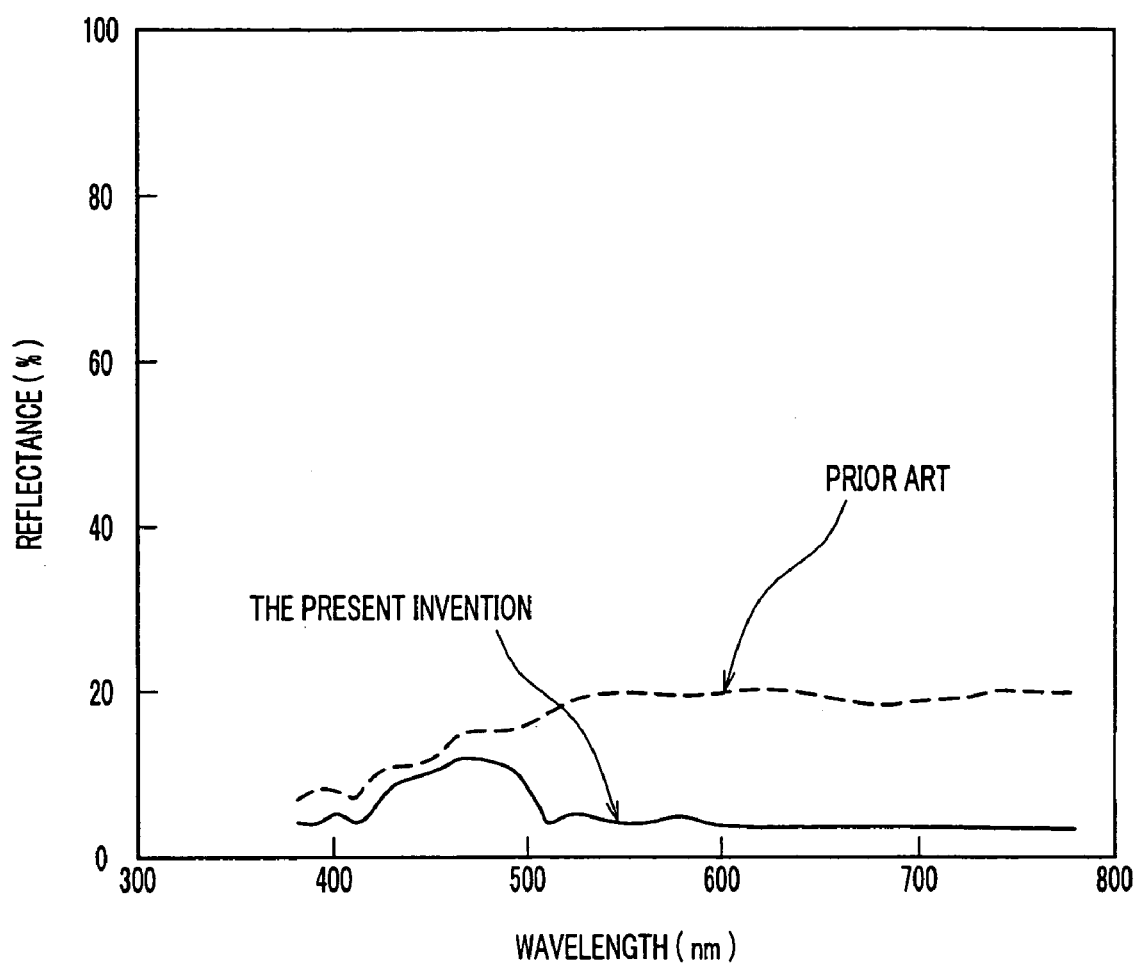
FIG. 4 is a drawing which shows one example of a spectral reflectance of the display device according to the present invention in comparison with the conventional technique.

FIG. 4 is a drawing which shows one example of a spectral reflectance of the display device according to the present invention in comparison with the conventional technique, and specifically shows one example of the spectral reflectance of the OLED display device using the cholesteric liquid crystal layer having characteristics exemplified in FIG. 3. For comparison, FIG. 4 shows the reflectance of the display device in the case where a plurality of cholesteric liquid crystal layers each having a different helical pitch are stacked as the polarization separator in order to realize a wide wavelength range of the selective reflection cover the visible wavelength range.

As shown in FIG. 4, in the case of the conventional technique where a plurality of cholesteric liquid crystal layers each having a different helical pitch are stacked as the polarization separator, a spectral reflectance is heightened over a wide wavelength range and the luminous reflectance becomes as high as 20%. In contrast, in the case where the wavelength range for main selective reflection is set to the wavelength range corresponding to the blue light, the wavelength range having a high spectral reflectance becomes only a light corresponding to the wavelength range of the selective reflectance of the cholesteric liquid crystal layer, and the luminous reflectance becomes 5%, which is quarter of the conventional technique. This indicates that under the same brightness of displaying, the contrast ratio of the display device according to the present invention under the ambient light (in bright environment) is four times that of the conventional technique.

It is noted that this reflectance is a value containing the surface reflectance of the polarizer plate, which is 4%, and considering that anti-reflective coating made of multilayers is formed on the polarizer plate, the reflectance of the present invention is very small, which is tenth the conventional technique and, thus, the contrast ratio of the display device according to the present invention under the ambient light is ten times that of the conventional technique. Specifically, the display device according to the present invention can realize the displaying of dark black image even in bright environment because of decreased reflection of the ambient light, and the contrast ratio can be increased.

Here, for suppressing the reflection of the ambient light, it is important, for allowing a human to feel that an unnecessary reflection is small, to reduce the reflection of a green light, which has a high relative luminous efficiency in a photopic vision, i.e., a light having a wavelength of from approximately 520 to 600 nm. For this reason, according to the present invention, the reflection of the ambient light is suppressed by making a wavelength range of the main selective reflection of the cholesteric liquid crystal layer narrow so as to become a part of the visible wavelength range, and setting the wavelength range of the main selective reflection of he cholesteric liquid crystal layer to be blue color, which is a low relative luminous efficiency in a photopic vision. Specifically, even if the wavelength range of the selective reflection is narrower than the visible wavelength range, when the central wavelength of the selective reflection resides around 555 nm, which is a high relative luminous efficiency in a photopic vision, the reflectance become high so that the contrast ratio under an ambient light is remarkably decreased. In contrast, if the central wavelength of the selective reflection is blue (wavelength from 450 nm to 480 nm) or red (wavelength from 640 nm to 680) and the reflection of a light having a wavelength from 520 nm to 600 nm, which is a high relative luminous efficiency in a photopic vision, is decreased, then the luminous reflectance becomes small, and an observer feels that unnecessary reflection is small.

Subsequently, improvement of color purity and improvement of efficiency will now be described. As shown in FIG. 2, amongst the light emitted from the emissive layer, almost all parts of the red light 1000R and the green light 1000G are transmitted through the cholesteric liquid crystal layer, which is the polarization separator 500, and approximately half of them is absorbed on the polarizer plate, and the remaining half is emitted to the side of the viewer 10000. On the other hand, amongst the light emitted from the emissive layer, almost all parts of the wavelength range of the blue light 1000B are overlapped with the wavelength range of the selective reflection of the cholesteric liquid crystal layer. For this reason, amongst the blue light, the light 1002, which corresponds to the wavelength range of the selective reflection of the cholesteric liquid crystal layer and is transmitted through the cholesteric liquid crystal layer is converted into a linearly polarized light, which is transmitted through the polarizer plate 600 by the action of the phase plate 700, and is transmitted through the polarizer plate 600 to be directed towards the side of the viewer 10000.

Also, amongst the blue light 1000B, the light 1003 having been reflected at the polarization separator 500 is transmitted through the emissive layer etc., while substantially maintaining its polarization states, then reflected at the reflective electrode 300, and is again directed towards the polarization separator 500. At the time of the reflection at the reflective electrode 300, the helicity direction of the light 1003 is reserved (i.e., the light 1003 becomes a circularly polarized light having a reverse helicity direction such as a dextrorotatory circularly polarized light) and, thus, at this time, the light 1003 is transmitted through the polarization separator 500. The light 1003 transmitted through the polarization separator 500 is converted into a linearly polarized light, which is transmitted through the polarizer plate 600 by the action of the phase plate 700, and then transmitted through the polarizer plate 600 to be directed towards the side of the viewer 10000.

Consequently, amongst the light emitting from the emissive layer 100, almost all parts of the light corresponding to the wavelength range of the selective reflection by the cholesteric liquid crystal layer are directed towards the side of the viewer 10000 without being absorbed on the polarizer plate 600. Specifically, amongst the lights which are absorbed on the polarizer plate to be useless in conventional, the light corresponding to the blue color, which is corresponds to the wavelength range of the selective reflection by the cholesteric liquid crystal layer is reflected at the polarization separator (cholesteric liquid crystal layer) can be reused, leading to the advantage in terms of being brightness.

Here, as shown in FIG. 3, the wavelength distribution of the selective reflection of the cholesteric liquid crystal layer making up the polarization separator 500 is generally a sharp distribution. As described above, the wavelength range of the selective reflection of cholesteric liquid crystal layer can make narrower than the wavelength range of the organic light-emitting diode by selecting Δn and the helical pitch p. Also, even in the case of the same light-emitting peak wavelength, when the light-emitting wavelength range is wide and is of gentle distribution, the light becomes a color, which is a low color purity (here, excitation purity: the ratio of the distance from the while light source in a chromaticity diagram) and is pale.

Consequently, if the wavelength range of the light which is reflected at the polarization separator 500 to be reused is set to be narrower peak band than that of the light emitting wavelength range of the emissive layer, the wavelength distribution of the light emitted from the display device in real becomes narrower distribution than the light emitted from the emissive layer and, thus, the excitation purity can be heightened. Specifically, in the display device according to the present invention, the excitation purity can be heightened to the light reflected at the polarization separator 500 to be reused relative to the excitation purity of the light emission by the organic light-emitting diode 24 itself. What is more, as described above, since the reflection of the ambient light becomes small when the wavelength range of the selective reflection of the cholesteric liquid crystal layer making up the polarization separator 500 is narrow, there is an advantage that much higher contrast ratio can be obtained under a bright condition.

Figure 5:
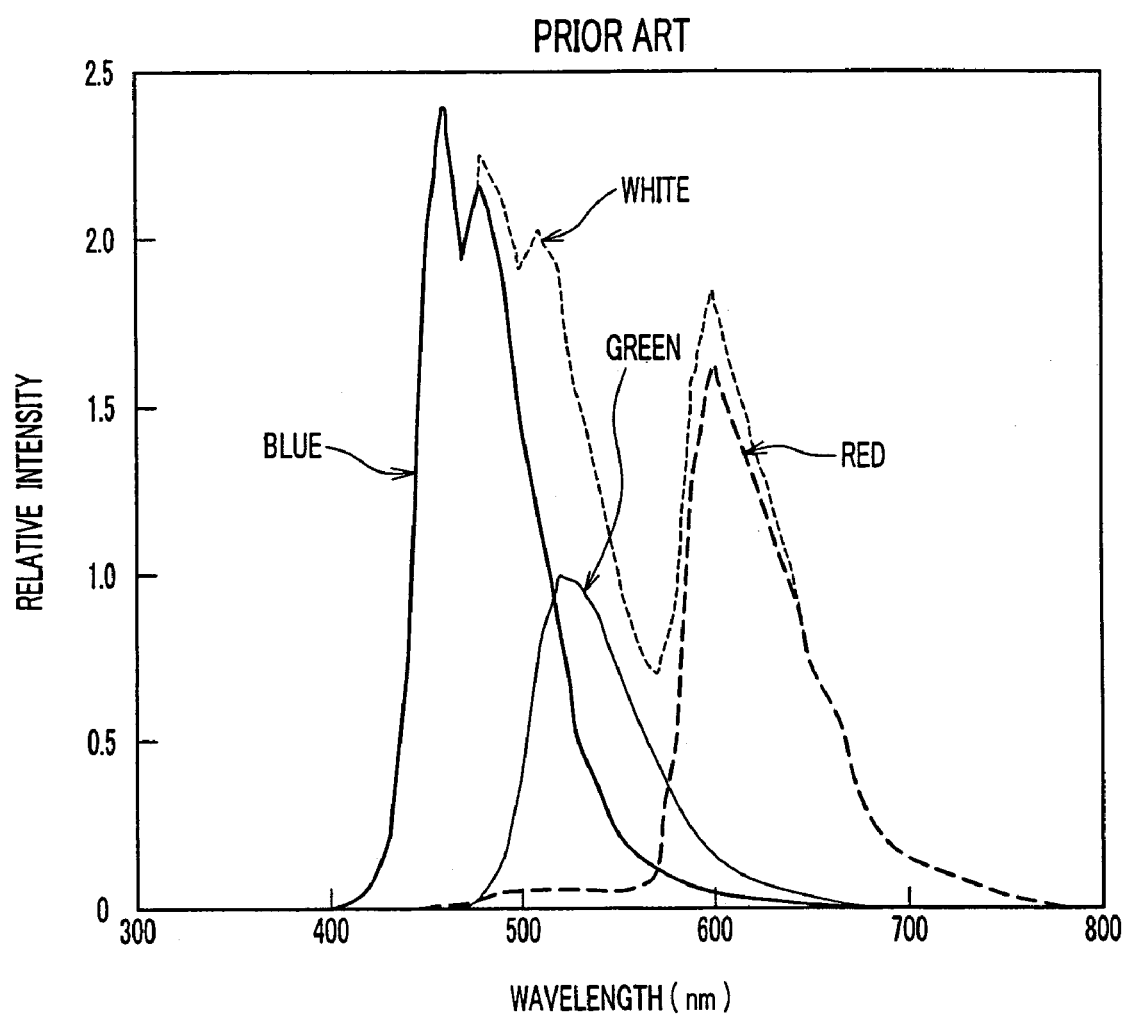
FIG. 5 is a drawing showing one example of the light emitting spectra of the conventional display device.

FIG. 5 is a drawing showing one example of the light emitting spectrum of the conventional display device; shows one example of a light emitting spectrum of the red light emitting pixel, one example of a light emitting spectrum of the green light emitting pixel, and one example of a light emitting spectrum of the blue light emitting pixel, when the OLED display device only possessing a circular polarizer plate is observed from the front side; and is a graph showing the wavelength-dependency of a relative value of the light emitting intensity (W/m$^2$/sr) of each organic color light emitting diode. The graph shown in FIG. 5 indicates the case where a white image is displayed in which an x,y-chromaticity coordinates (x,y)=(0.3100, 0.3300) in CIE 1931 chromaticity diagram. In this figure, the lines shown as blue, green, red, and white show respective color light intensity as a normalized value (relative value) at the maximum intensity of the green light, when the OLED display device is observed from the front side.

Figure 6:
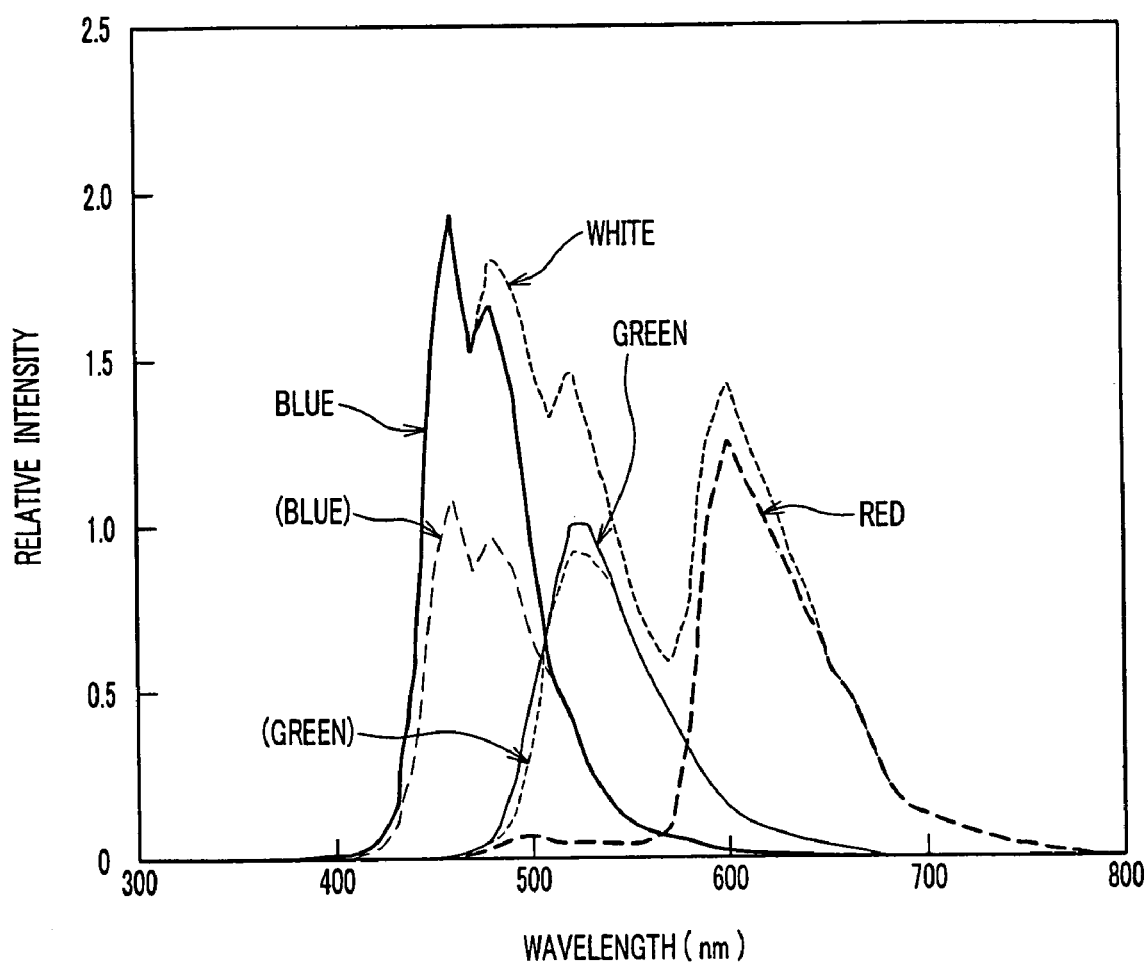
FIG. 6 is a drawing showing one example of the light emitting spectra according to the present invention.

FIG. 6 is a drawing showing one example of the light emitting spectra according to the present invention; shows the wavelength-dependency of relative intensity of each emitted color when in the OLED display device composed of an organic light emitting diode having the same light emitting spectrum as that shown in FIG. 5, the cholesteric liquid crystal layer shown in FIG. 3 is used as the polarization separator 500. Similar to FIG. 5, FIG. 6 shows the case where a white image is displayed in which an x,y-chromaticity coordinates (x,y)=(0.3100, 0.3300) in CIE 1931 chromaticity diagram. In this figure, the lines shown as blue, green, red, and white show respective color light intensity as a normalized value (relative value) at the maximum intensity of the green light, when the OLED display device is observed from the front side. For reference, the case where no polarization separator is used at the same light emitting intensity, i.e., the case where only the circular polarizer plate is used are depicted as (BLUE) and (GREEN). With respect to red, the difference due to the presence or absence of the polarization separator is small, and thus, it is not depicted.

Figure 7:
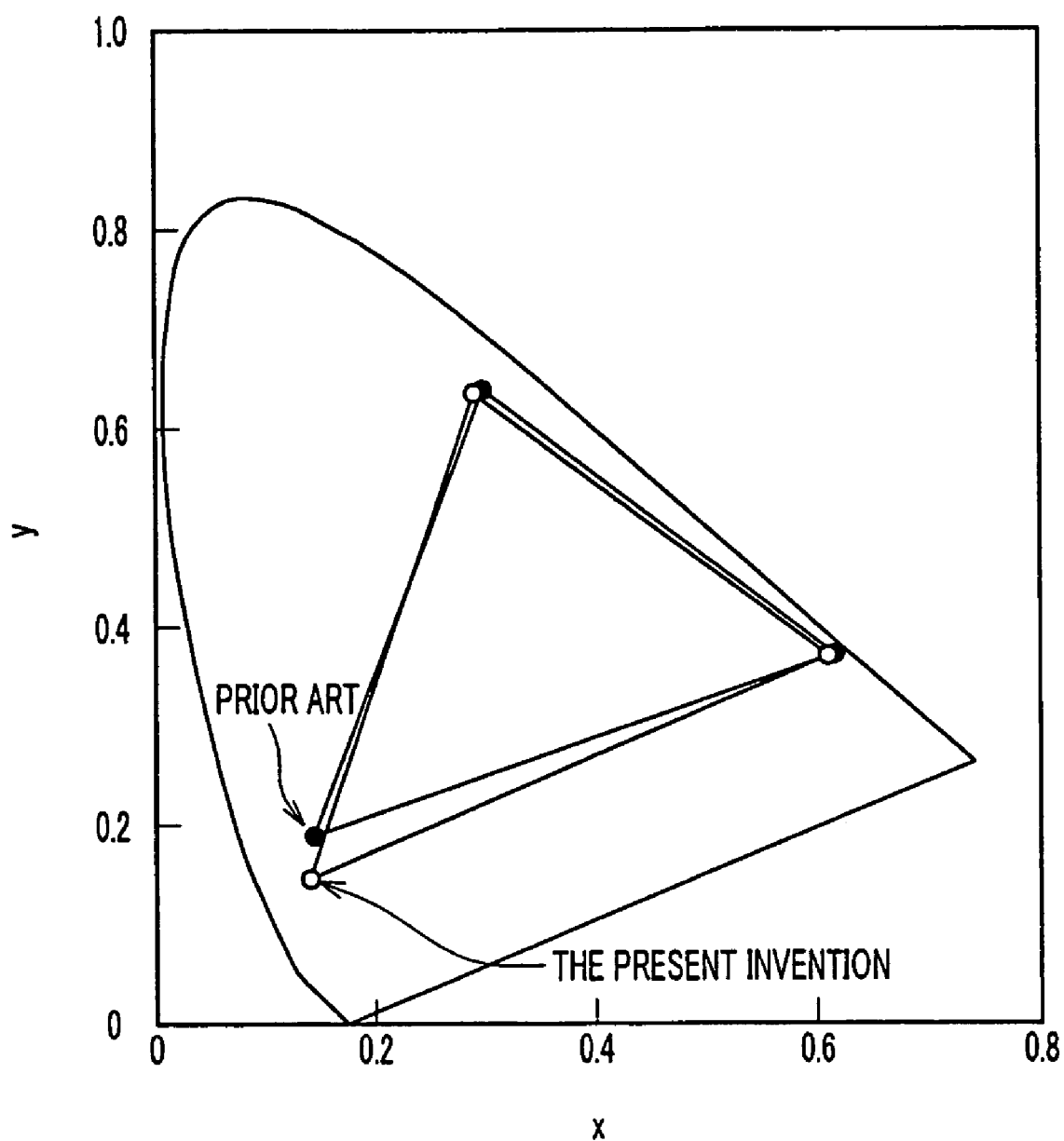
FIG. 7 shows one example of chromaticity coordinates.

FIG. 7 shows one example of chromaticity coordinates showing an x,y-chromaticity coordinates in CIE 1931 chromaticity diagram when red, blue and green each is displayed as a single color in the OLED display device having a light emitting spectrum exemplified in FIG. 6. For comparison, FIG. 7 also shows an x,y-chromaticity coordinates of the conventional OLED display device only having a circular polarizer plate.

As for the conventional OLED display device where a plurality cholesteric liquid crystal layers each having a different helical pitch are deposited, or where a cholesteric liquid crystal layer whose helical pitch is continuously changed is used to realize a wide wavelength range of the selective reflection over a full visible wavelength range, although the absolute value of the intensity become large, the relative intensity thereof shown in FIG. 5 and the x,y-chromaticity coordinates thereof shown in FIG. 7 may be considered to be similar. As exemplified in FIG. 5, the organic light emitting diode at the present situation cannot give sufficient color reproductivity range shown in FIG. 7, since its central wavelength of emitting light is different from a desired wavelength or the distribution of the light emitting wavelength is wide and gentle.

For example, when a white color whose chromaticity coordinates (x,y)=(0.3100, 0.3300), since the balance of the chromaticity coordinates of each light emitting color is bad, it is required to decrease the light emitting intensity of the organic light-emitting diode for green light emission, and to increase the light emitting intensity of the organic light-emitting diode for red light emission and that of the organic light-emitting diode for blue light emission. Here, the luminous efficiency of the organic light-emitting diode for green light emission is higher than that of the organic light-emitting diode for red light emission and that of the organic light-emitting diode for blue light emission. For this reason, in the case of displaying a white color, the emission intensity of the organic light-emitting diode for green light emission, which has high efficiency, is decreased, and the emission intensities of the organic light-emitting diode for red light emission and that of for blue light emission, which has low efficiency, are relatively increased, whereby the total efficiency of the display device is decreased.

Furthermore, the necessary of increasing the emission intensities of blue and red colors leads to the fact that in the case of displaying white color, the power of the organic light-emitting diode for blue color or for red color becomes larger than that of the organic light-emitting diode for green color, and thus, the power consumption is differed in the colors. For example, in the case of displaying a white color with a luminance of 100 cd/m$^2$, considering that efficiency of each color, the ratio of the power consumption of the organic light-emitting diodes for emitting red (R), green (G), and blue (B) colors (R:G:B) becomes 5.04:1.00:2.81, indicating that depending upon the colors, the maximum power difference as much as five times occurs.

In contrast, as shown in FIG. 6, according to the present invention, by reusing the light within the wavelength range effective for blue light, which has conventionally been absorbed on the polarizer plate, the intensity of the light corresponding to the blue light is increased. Specifically, the light emission spectrum depicted as BLUE in this figure can be realized at the light-emission spectrum shown as (BLUE) in the case of the conventional OLED display device only having the circular polarizer plate. For this reason, with regard to the single color of blue, according to the OLED display device according to this embodiment, the maximum intensity increases 1.77 times, and the luminance increases 1.27 times the conventional OLED display device only having the circular polarizer plate. Furthermore, whereas the x,y-chromaticity coordinates (x,y) is (0.1413, 0.1899) in the conventional OLED display device, the x,y-chromaticity coordinates (x,y) in the present invention is (0.1370, 0.1486), indicating that the excitation purity is increased from 75.4% to 82.3% to widen a color gamut.

Also, for example, in the case where the white color whose chromaticity coordinates (x,y) is (0.3100, 0.3300), and the luminance is 100 cd/m$^2$, the ratio of the power consumption of the organic light-emitting diodes for emitting red (R), green (G), and blue (B) colors (R:G:B) becomes 3.95:1.00:1.10, indicating that difference of the power consumption in colors is decreased and the power consumption of the green color and that of the blue color are substantially equal to each other. Moreover, by the fact that the light emission intensity of the organic light-emitting diode for green light, which has a high luminous efficiency, is relatively increased, the power consumption for displaying a white color is decreased and becomes approximately 84% in comparison with the conventional OLED display device only having the circular polarizer plate.

It is noted that as exemplified in FIG. 3, the selective reflection at the cholesteric liquid crystal layer has a purity of minor reflective wavelength ranges in addition to the main reflective wavelength range. Since these minor reflective wavelength ranges contribute to the enhancement of the luminance, for example, one of the minor reflective wavelength ranges must be accorded with the peak wavelength of the organic light-emitting diode for green which has a high relative luminous efficiency in a photopic vision. This contributes to the enhancement of the luminance and the total efficiency of the display device. In this embodiment, the light emission spectrum shown as GREEN in FIG. 6 can be realized in the light emission spectrum shown as (GREEN) in the case of the conventional OLED display device only having a circularly polarizer plate, indicating that the luminescence is increased 6%. Since the reflection of the wavelength ranges other than the main wavelength range of the selective reflection are small, the increasing of the reflection of the ambient light becomes small, which would not lead to serious problem.

It is noted that while the case where the wavelength range of the selective reflection of the cholesteric liquid crystal layer is set to be blue has been described, the present invention is not intended to exclude the case where the wavelength range of the selective reflection of the cholesteric liquid crystal layer is set to be red in terms of avoiding a high relative luminous efficiency in a photopic vision for the purpose of suppressing the reflection of the ambient light. In this case, the chromaticity of the red can be improved and the luminescence can be enhanced to decrease the total power consumption of the display device. However, in the case of considering the viewing angle-dependency, it is desired that the wavelength range of the selective reflection of the cholesteric liquid crystal layer is set to be blue.

Here, the wavelength range of the selective reflection of the cholesteric liquid crystal layer is changed depending upon an incident angle of the light. Specifically, if the incident angle of the light is increased, the wavelength range of the selective reflection is sifted to the side of short wavelength. For this reason, in the case where the wavelength range of the selective reflection corresponds to a red color, the wavelength range of the selective reflection is shifted towards the green side, which has a high relative luminous efficiency in a photopic vision, if the incident angle of the light is increased to increase the luminous reflectance. Conversely, in the case where the wavelength range of the selective reflection corresponds to a blue color, the wavelength range of the selective reflection is shifted towards a ultraviolet range, which has a low relative luminous efficiency in a photopic vision. This does not lead to any problem because of ultraviolet range is difficult to be viewed.

A high luminous efficiency is expected in a phosphorescent organomatallic materials, which are said to utilize phosophorescence, and at the present situation, there are materials for obtaining a high luminous efficiency in the green light emission and the red light emission. However, from now on, there is no material for obtaining a high luminous efficiency in the blue light emission like that for obtaining a high luminous efficiency in the green light emission and the red light emission. Consequently, with regard to the green light emission and the red light emission, phosphorescent organomatallic materials are used, and with regard to the blue light emission, a fluorescent material is used and the polarization separator having the reflective wavelength range in a blue light is used to enhance a blue light. Such a configuration as just mentioned realize a display device having well-balance efficiency for primary colors and high luminous efficiency.

Figure 8:
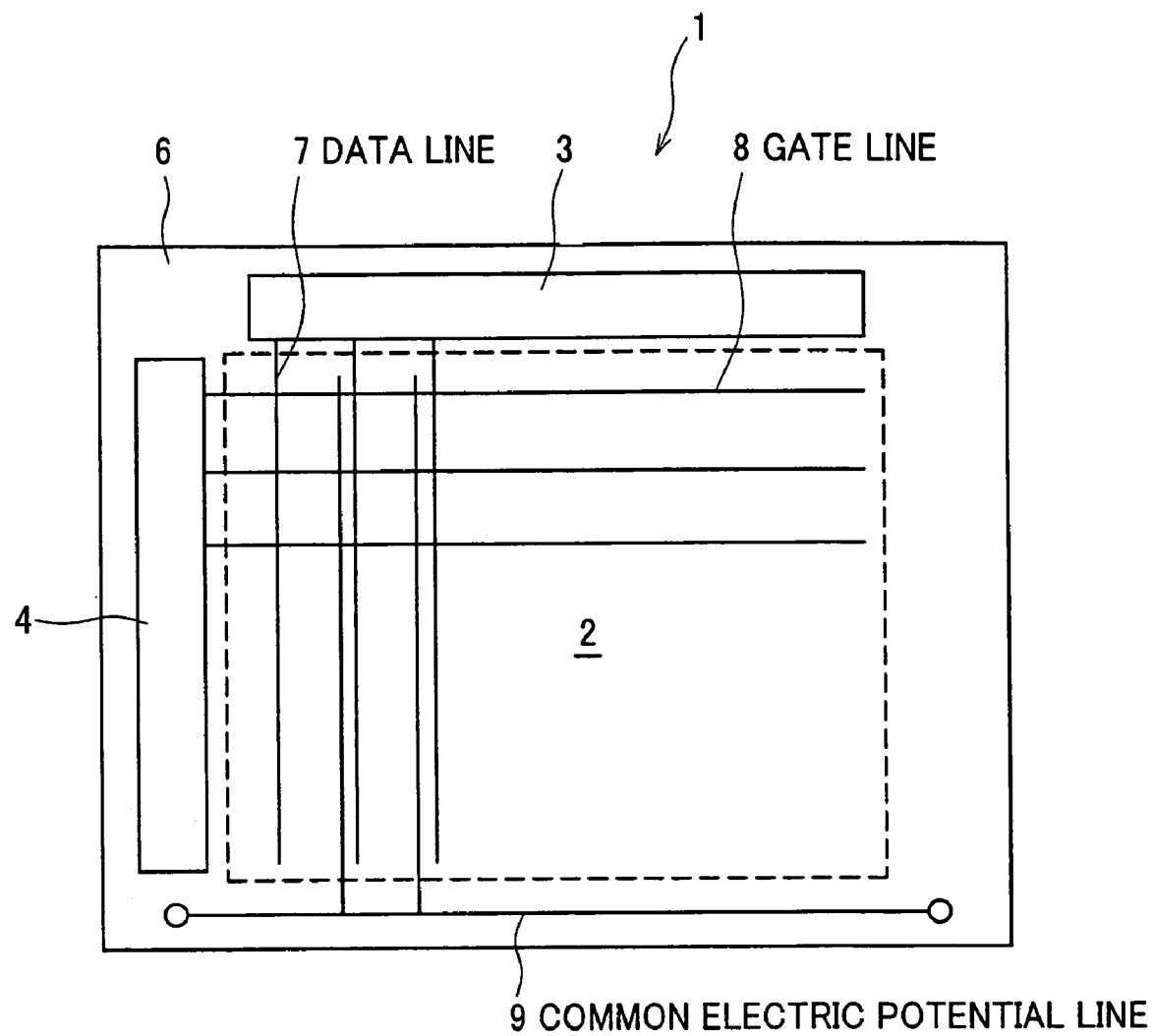
FIG. 8 is a block diagram schematically showing the layout of the whole of the OLED display device according an embodiment of the present invention.
Figure 9:
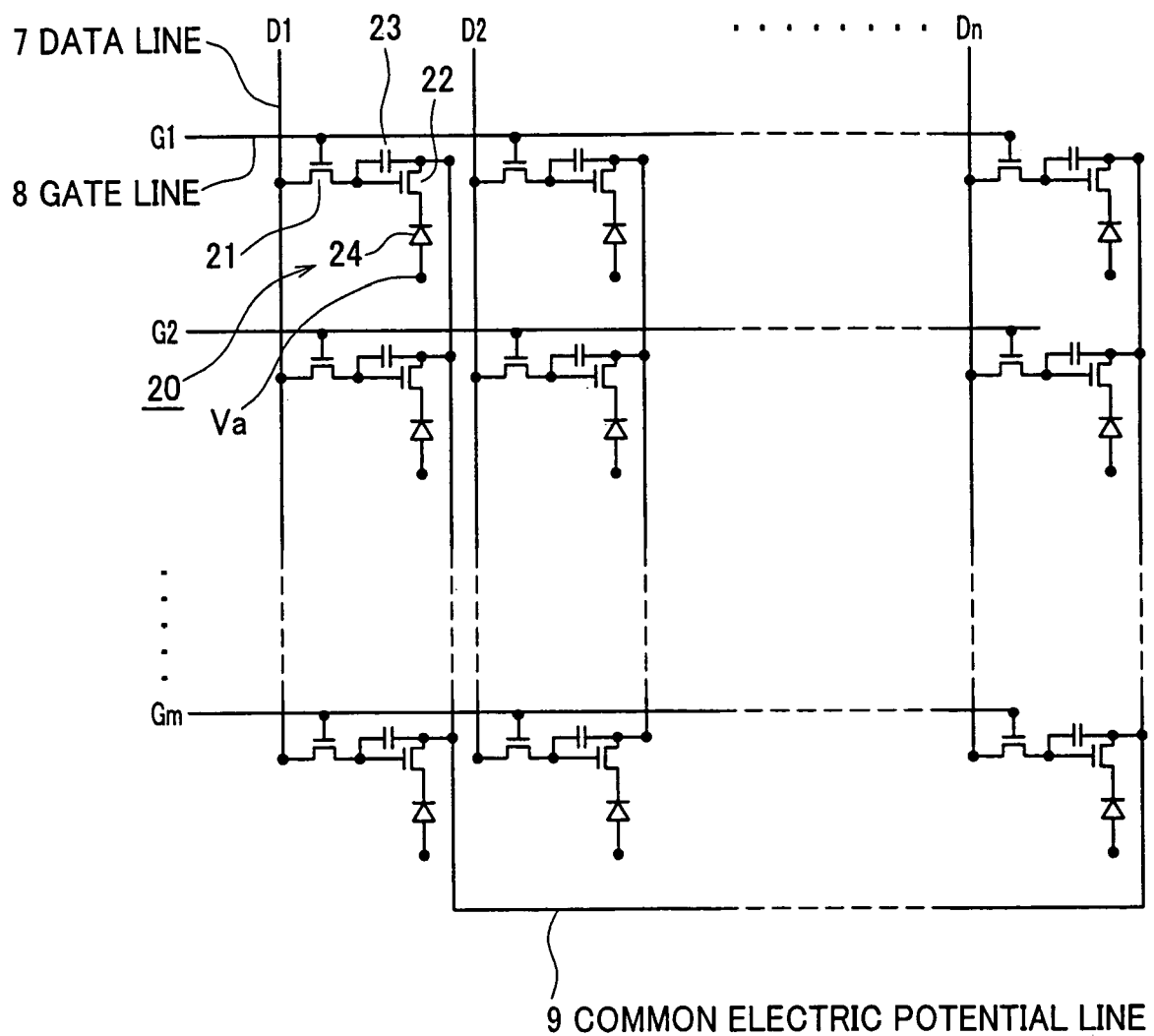
FIG. 9 shows an equivalent circuit of the active matrix constituted in a display portion.

Subsequently, an embodiment of the OLED display device which is driven by an active matrix will now be described by referring to the drawings. FIG. 8 is a block diagram schematically showing the layout of the whole of the OLED display device according an embodiment of the present invention, and FIG. 9 shows an equivalent circuit of the active matrix constituted in a display portion. In FIG. 8 and FIG. 9, referential number 1 indicates an OLED display device, and 2 indicates a display portion thereof. As shown in FIG. 8, the display portion 2 is provided on approximately center of a substrate 6 of the OLED display device. In this figure, a data driving circuit 3 which outputs an image signal to a data line 7 is provided on an upper portion of the display portion 2, and a scan driving circuit 4 which outputs a scan signal to a gate line 8 is provided on a left side of the display portion 2. These driving circuits 3 and 4 are composed of a shift register circuit, a level shifter circuit, analog switching circuit and so on comprising complementary type circuit due to N-channel type TFT (thin film transistor) and P-channel TFT.

Similar to the active matrix type liquid crystal display device, on the display device 1, a plurality of gate lines and a plurality of data lines extending to the direction crossing to the direction of the extension of the gate lines are provided. As shown in FIG. 9, pixels 20 in a matrix state are placed at portions where these gate lines G1, G2, ... Gm and these data lines D1, D2, ... Dn are crossed to each other. Each pixel is composed of an organic light-emitting diode 24, a storage capacitor 23, a switching transistor 21 comprising an N-channel type TFT where a gate electrode are connected to the gate line, one of source/drain electrodes is connected to the data line, and the other is connected to the storage capacitor 23, and a driving transistor 21 comprising an N-channel type TFT where the gate electrode is connected to the storage capacitor 23, and the source electrode is connected to a common electric potential line 9 extending in the same direction as the direction of the data line, and the drain electrode is connected to one electrode (cathode) of the organic light-emitting diode 24. The other electrode (anode) of the organic light-emitting diode 24 is connected to a power supply line common to all pixels and is kept at a constant electric potential Va. The organic light-emitting diodes 24 each emitting any of colors red, green and blue are placed in a matrix form in a prescribed order.

According to the configuration described above, when the switching transistor 21 is in an on state by the scan signal, an image signal from the data line is written in the storage capacitor 23 via the switching transistor 21. Consequently, the gate electrode of the driving transistor 22 is kept at an electric potential corresponding to the image signal by the storage capacitor 23 even if the switching transistor 21 is in an off state. The driving transistor 22 is kept at a driving state of a source-ground mode excelling in constant current property, and the current is kept running through the organic light-emitting diode 24 to maintain the light-emitting state. At this time, the light emitting luminance depends upon the data written in the storage capacitor 23. The stopping of the light emission is carried out by turning the driving transistor 22 off.

Figure 10:
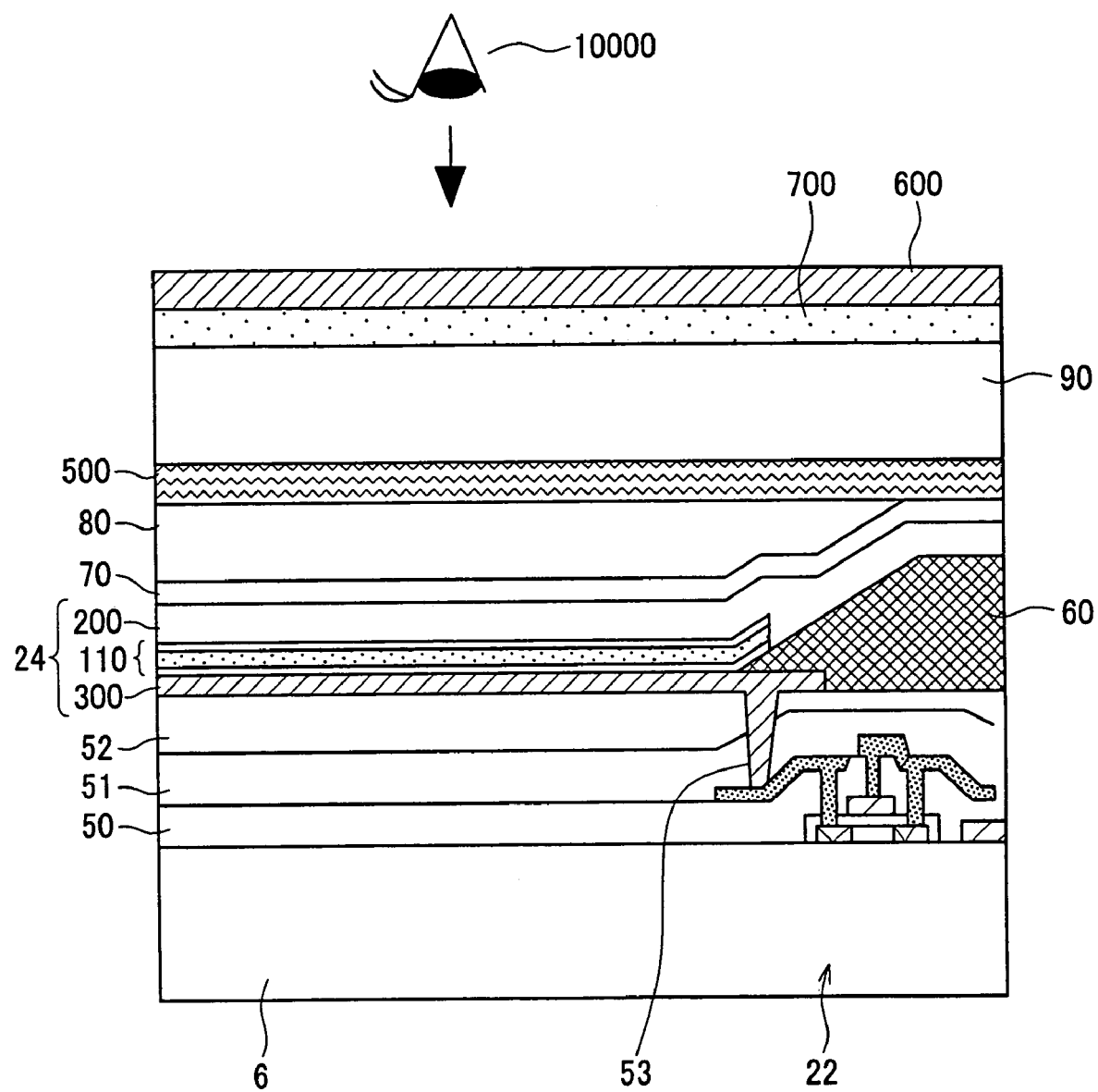
FIG. 10 is a partially cross-sectional view showing a schematic configuration for explaining the basic configuration the OLED display device according to the present invention.
Figure 11:
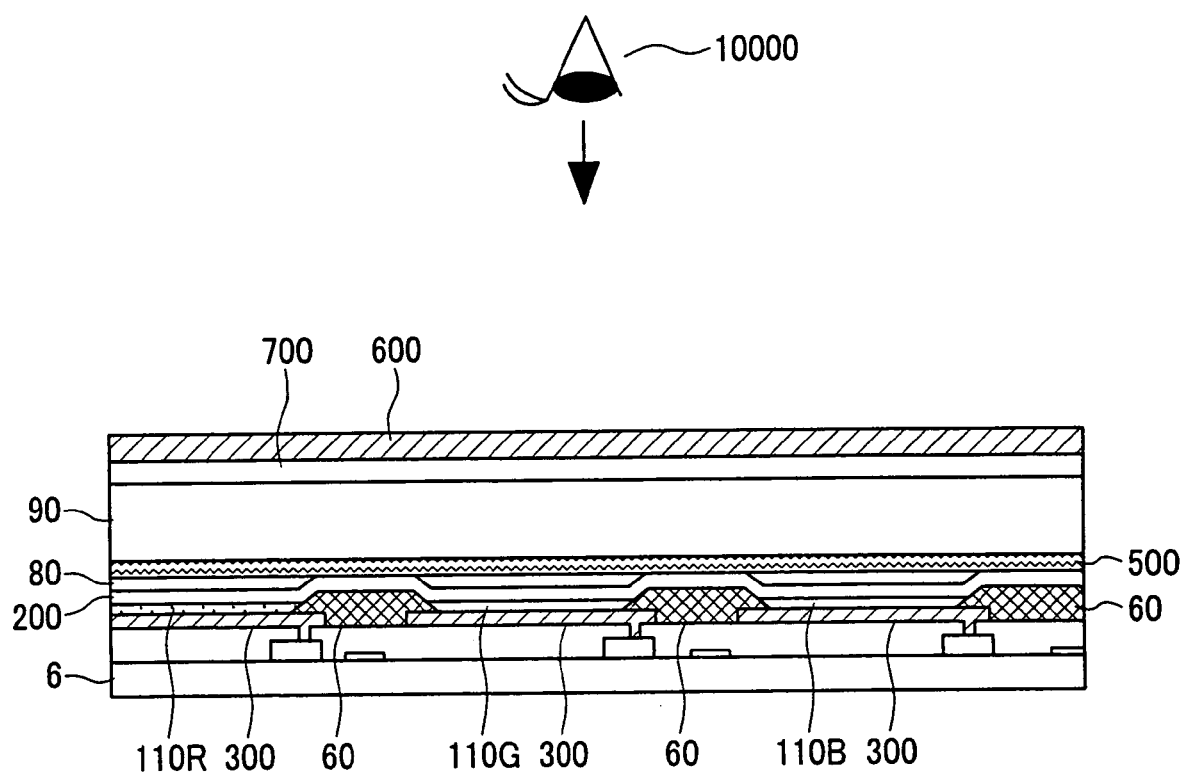
FIG. 11 is a partially cross-sectional view showing a schematic configuration for explaining the basic configuration the OLED display device according to the present invention, which displays full color images.

Subsequently, a configuration of an embodiment of the OLED display device according to the present invention will now be described by referring to FIG. 10 and FIG. 11. FIG. 10 is a partially cross-sectional view showing a schematic configuration for explaining the basic configuration the OLED display device according to the present invention. FIG. 11 is a partially cross-sectional view showing a schematic configuration for explaining the basic configuration the OLED display device according to the present invention, which displays full color images. In FIG. 11, the organic layer 110 is configured to be patterned light emitting organic layers for each primary colors, i.e., a red light emitting organic layer 110R, a green light emitting organic layer 110G, and a blue light emitting organic layer 100B. This display device is an OLED display device having a so-called top-emitting structure, in which lights are emitted from the direction reverse to the substrate on which the organic light emitting diode is formed. Hereinafter, the OLED display device is sometimes abbreviated as the "display device".

In FIG. 10, the OLED display device according to this embodiment has a flat first substrate 6 made of a glass or such on which a silicon film in an island state is placed for forming a switching transistor 21 shown in FIG. 9 (not shown), a driving transistor 22, and a gate insulation layer formed thereon. On the gate insulation layer, a gate electrode, gate lines, an electrode for storage capacitor are formed, and thereafter, a source and drain ranges are formed on the gate electrode in a self alignment manner. Furthermore, a first interlayer insulation layer 50 is provided, and data lines, common electric potential line, and an electrode for a storage capacitor are formed via a contact hole. Furthermore, a flat layer 52 comprising a second interlayer insulation layer 51 and an insulation material is stacked, on which a reflective electrode 300 serving as a cathode for the organic light-emitting diode 24 is formed in an island form. The reflective electrode 300 is connected to the drain of the driving transistor 22 via the contact hole 53 of the second interlayer insulation layer 51 and the flat layer 52.

On the flat layer 52, a dividing wall 60 is formed so as to surround the area where the reflective electrode 300 is formed. In this case, the dividing wall 60 may covered with a part of the area of the reflective electrode 300 such as the contact hole. It is desirable for the dividing wall 60 to at least select a material which has no or little reflection of the light corresponding to the wavelength range at which the polarization separator is reflected. Specifically, the dividing wall preferably serves as means for preventing the reflection of the light having a wavelength corresponding to the wavelength range at which the polarization separator is reflected. For example, many of photoresist resins which can form a pattern by a photolithographic process in which a light having a short wavelength such as ultraviolet light or near ultraviolet light generally absorbs a light having a short wavelength range corresponding to blue light, these material can be used as the material for the dividing wall. Also, photosensitive resin material having a light-absorbing pigment or dye dispersed therein may be used as the material for the dividing wall. The material for the dividing wall 60 may be formed by a photolithographic process.

The organic layer 110 which has emissive layers, each of which emits any of red, green and blue colors are patterned on the reflective electrode 300 in a prescribed position. The organic layer 110 may be selected from the configurations and materials described above. The color patterning of the organic layer 110 can be carried out by the conventionally known selective deposition method of vacuum-evaporating an organic film utilizing a shadow mask in the case were the organic layer comprises a low molecular material (for example, see S. Miyaguchi, et., al,: "Organic LED Fullcolor Passive-matrix Display", Journal of the SID, 7, 3, pp. 221–226 (1999)). In this process, the dividing wall 60 may be used as a stopper element for the shadow mask.

Also, in the case where the organic layer 110 comprises a polymeric material, the conventionally known ink-ject patterning technique can be used (for example, see T. Shimoda, et., al.; "Multicolor Pixel Patterning of Light-Emitting Polymers by Ink-Jet Printing", SID 99 DIGEST, 376 (1999). In this process, the dividing wall 60 may be acted as a bank for separating the pixel ranges.

A transparent electrode 200 serving as an anode is formed on the entire surface of the organic layer 110 as the opposite electrode. Optionally, a protective layer 70 comprising a transparent insulating material is formed on the transparent electrode 200. The formation of the protective layer 70 is for the purpose of protecting the transparent electrode 200 and for making it easy to deposit members to be placed thereon. As the protective layer 70, those which are made of transparent organic materials such as acrylic resins, benzo cyclobutadiene resins, polyimide resins. These organic materials can relatively easily be planarized by film-formation through a spin coater.

A second substrate 90, which comprises an optically isotropic, transparent, and flat substrate is placed on the protective layer. On one surface of the second substrate 90 is formed a polarization separator 500 and on the other surface thereof are stacked a phase plate 700 and a polarizer plate 600. The second substrate 90 is stacked so that the surface where the polarization separator 500 is faced to the surface of the first substrate 6 where the organic layer 110 is formed. As the materials for the second substrate, a transparent glass, a polymer film such as polycarbonate film, and triacetyl cellulose film, formed by a casting method; an optically isotropic plastic film or sheet such as alicyclic acryl resin formed by an injection molding (OPTOREZ® produced by Hitachi Chemical Co., Ltd.).

In the case where the polymer film or the resin sheet is used, it is important for enlarging a lifetime of the organic layer to be imparted to a gas barrier property, e.g., by subjecting a gas barrier treatment (such as the formation of a gas barrier layer) or by placing a glass having a thickness of several ten microns. If it is possible to be subjected to a treatment that sufficient gas barrier property can be obtained, the second substrate may be omitted to construct a stack comprising the polarization separator 500, the phase plate 700 and the polarizer plate 600. As described above, the polarization separator 500 comprising the cholesteric liquid crystal layer having a main wavelength range of the selective reflection corresponding to the blue light is used.

As a process for forming the polarization separator 500 comprising the cholesteric liquid crystal layer on the second substrate 90, a process can be mentioned, which comprises applying a liquid crystal polymer on the oriented second substrate 90, adjusting the temperature to a prescribed temperature utilizing the thermochromic property of the selective reflection wavelength, fixing the structure through a photo-polymerization to form a cholesteric liquid crystal layer having a desired selective reflection wavelength, but the present invention is not restricted thereto.

Also, the cholesteric liquid crystal layer having a desired selective reflection wavelength having been formed on a triacetyl cellulose film may be adhered on the second substrate 90 by a transparent adhesive. Optionally, a transparent protective layer may be provided on the cholesteric liquid crystal layer.

The phase plate 700 and the polarizer plate 600 are stacked on the surface reverse to the surface having the polarization separator 500 formed thereon. The phase plate 700 and the polarizer plate 600 are as described above, and they are adhered by an acrylic transparent adhesive, respectively. No second substrate may be used and the polarization separator may be directly formed on the phase plate. In this case, a material, which never changes characteristics such as the phase difference of the phase plate in the process for forming the cholesteric liquid crystal layer may preferably used.

The full surface of the first substrate 6 and the full surface of the second substrate 90 may be brought into closely contact with each other so that no gas is incorporated. In terms of the reason which will be described later on, however, it is preferable to apply a sealing agent having a spacer material such as beads and a rod incorporated therein to the circumference of the display portion in a frame state to seal and adhere them in the state where nitrogen is sealed in a space 80.

Figure 12:
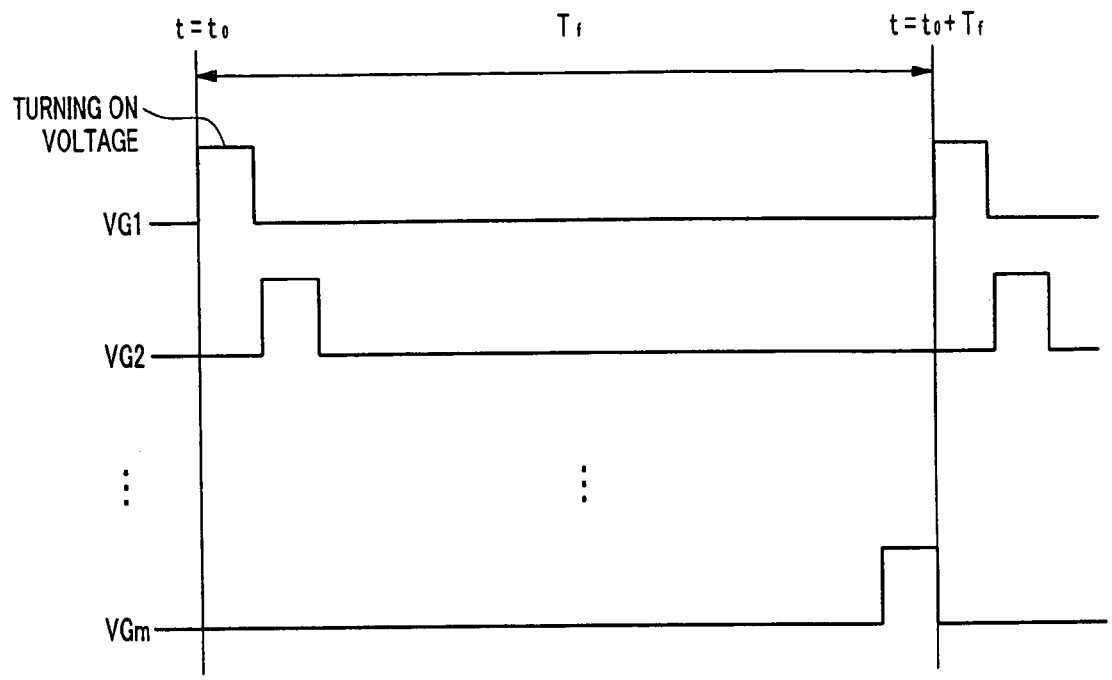
FIG. 12 is an explanatory drawing showing one embodiment of the display operation of the OLED display device according to the present invention.
Figure 13:
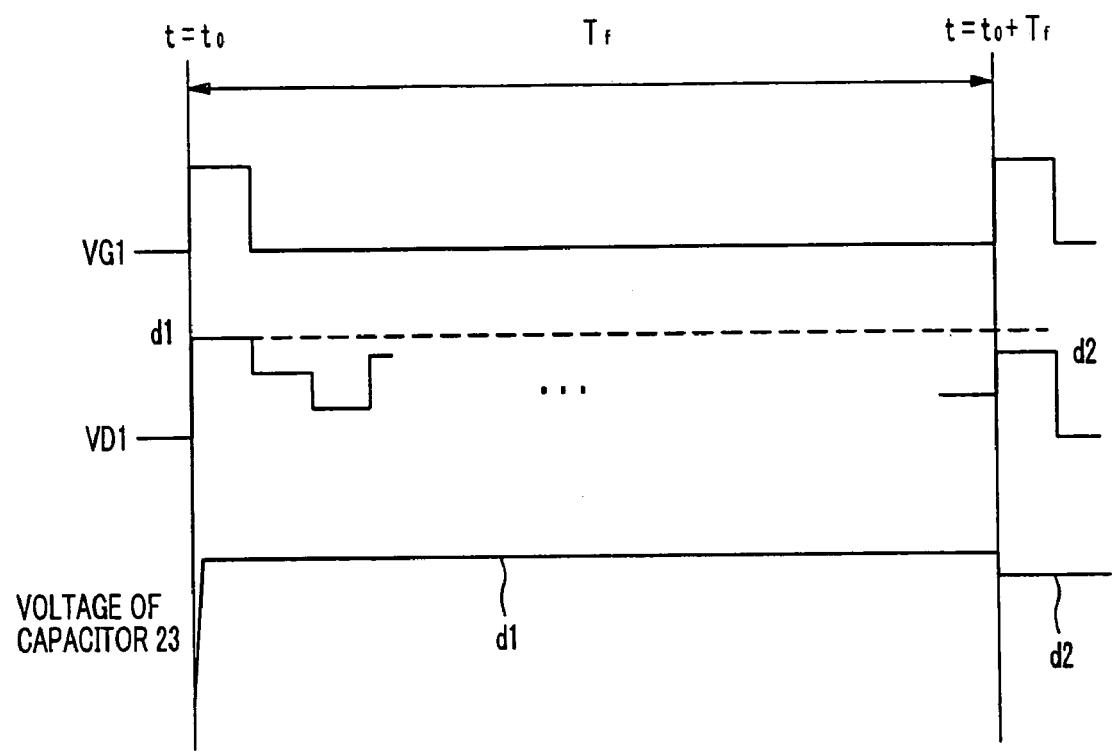
FIG. 13 is an explanatory drawing showing one embodiment of the display operation of the OLED display device according to the present invention.

Subsequently, the display operation of the OLED display device 1 according to this embodiment will now be described by referring to FIG. 9, FIG. 12 and FIG. 13 each is an explanatory drawing showing one embodiment of the display operation of the OLED display device according to the present invention, where FIG. 12 is a time chart of the voltages VG1, VG1, . . . VGm gradually applied to the gate lines G1, G2, . . . Gm, and FIG. 13 is a time chart which exemplifies the voltage situations of the gate voltage VG1 and the data voltage VD1 positioned at first line and first column, and the storage capacitor 23.

As shown in FIG. 12, voltages VG1, VG1, . . . VGm, which gradually turn the switching transistor 21 on, are applied to the gate lines G1, G2, . . . Gm. At the time $t=t_0$, when the voltage VG1, which turns the switching transistor 21 on, is applied to the gate line G1, one scanning in the vertical direction is completed within one frame period T1, and the turning on voltage is applied to the gate G1 at the time $t=t_0+Tf$. In this driving scheme, the period for applying the turning on voltage to one gate line is not more than Tf/m. Generally, the Tf value which is used is approximately $\frac{1}{60}$ second.

When the turning on voltage is applied to a given gate voltage, all of the switching transistors connected to that gate lines are the on state, and being synchronized therewith, the data voltages corresponding to the image signal are applied to the data lines D1, D2, . . . Dn. Such manner is called linegradul scanning manner, and is a manner generally used in an active matrix liquid crystal.

Subsequently, paying attention to the pixel positioned at first line and first column, the voltage states of the gate voltage VG1 and the data voltage Vd and the storage capacitor 23 will be described by referring to FIG. 13. At the time $t=t_0$, the value of the data voltage VD synchronized with the voltage VG1 is taken as d1, and the data voltage at the next frame $t=t_0+Tf$ is taken as d2. In this case, while the turning on voltage is applied to the gate line G1, these data voltages are stored in the storage capacitor 23, and during the course of 1 frame, these data voltages are kept at these values. These voltage values define the gate voltage of the driving transistor 22 and the current value running through the transistor is controlled and, thus, a constant current defined by the voltage (constant) applied by them and the common electric potential line 9 and the voltage Va (constant) runs through the organic light-emitting diode to bring about a prescribed light emission.

Specifically, being synchronized with the application of the turning on voltage to the gate line corresponding to the pixel which should control the light emission, the voltage corresponding to the image information is applied via the data line, whereby the light emission of the pixel can be controlled. Consequently, the light emission of a plurality of the pixels making up the display portion is controlled depending upon the image information, whereby a desired image can be displayed. Since the response time from the application of the voltage between both ends of the cathode and the anode of the organic light-emitting diode to the starting of the light emission is usually not more than 1 microsecond, the image displaying, which can follow up rapidly moving image can be realized.

Here, when the current running through the organic light-emitting diode is increased, the amount of the light emission of the organic light-emitting diode becomes large to obtain bright displaying as a rule, but the power consumption is increased in so much, the lifetime of the pixel (for example, the period until the luminance becomes half the initial luminance) is decreased.

As described above, the OLED display device 1 according to this embodiment can effectively utilize the light corresponding to the blue light, which has conventionally been absorbed on the polarizer plate to be lost, by the action of the polarization separator and, thus, the luminance can be improved, and the power consumed by the organic light-emitting diode when a white color is displayed can be decreased. For this reason, a display device which has a high luminance and can display a bright image using the same power consumption can be realized. Alternatively, when the luminance (brightness) is the same, the current running through the organic light-emitting diode can be decreased and, thus, the power consumption can be decreased and, what is more, the display device having a long lifetime can be realized.

Furthermore, as described above, by the action of the polarization separator, the OLED display device 1 according to this embodiment has an advantage that the excitation purity of the light practically emitting to the side of the viewer is improved by the light emission itself emitted from the emissive layer with regard to the blue light.

In the OLED display device 1 according to this embodiment, the dividing wall 60 as shown in FIG. 10 is provided around the light-emitting range of the organic light-emitting diode constituting each pixel. The dividing wall 60 does not reflect at least the light having the wavelength of the reflection at the polarization separator 500. In this case, as for the light entering in the light emission range of the organic light-emitting diode amongst the ambient light entering in the OLED display device from the outer circumference under a bright environment, the light having a wavelength corresponding to the wavelength range reflected at the polarization separator 500 is reflected, but as for the light entering in the dividing wall, the light having a wavelength corresponding to the wavelength range reflected at the polarization separator 500 is not reflected, and even if the lights having a wavelength other than the wavelength range reflected at the polarization separator 500 are reflected, they are not emitted out of the display device because they are absorbed on the polarizer plate. Consequently, the reflection of the ambient light so much as the range of the dividing wall and, thus, the contrast ratio under a bright condition is enhanced.

Furthermore, since the dividing wall prevents the light emitted from the emissive layer and reflected at the polarization separator from being leaked into another pixel, it has an effect for preventing cross-talk or blooming. Specifically, since each pixel is optically separated by the dividing wall, high quality display without cross-talk or blooming can be obtained.

The dividing wall 60 can be acted as a spacer at the time of depositing the first substrate having the organic light-emitting diode formed thereon on the second substrate having the polarization separator formed thereon. In this case, it has an effect for preventing a defect due the contact of the organic light-emitting diode with the polarization separator.

Furthermore, the polarization separator, the phase plate, and the polarizer plate are formed in a plane form, and there is no requirement for the alignment with the pixel whose organic layer is patterned and, thus, the effect for improving the productivity can be obtained. Here, an embodiment has been described in which the polarization separator and the organic light-emitting diode are formed on the different substrates, and they are finally deposited. This is because in the case of forming both parts on the same substrate, for example, forming the polarization separator on the substrate having the organic layer and the like already being formed, there is a possibility to bring about deficiency such as the deterioration of the organic layer, at the time of forming the cholesteric liquid crystal layer making up the polarization separator. Specifically, when the polarization separator and the organic light-emitting diode are formed on the different substrates respectively, the degree of the freedom in each state is increased, and they are not deteriorated with each other, making it possible to construct the device having much more high performance. However, for example, if a highly resistant organic material is developed in the near future, the polarization separator and the organic light-emitting diode may be formed on the same substrate.

In the OLED display device according to the present invention, if the distance between the polarization separator and the reflective electrode is long, there would be possibility to bring about trouble, i.e., the light reflected at the polarization separator is leaked into the pixel other than the corresponding pixel, leading to the decreasing of the resolution, the light emitted from the emissive layer or the light reflected at the polarization separator are absorbed on the dividing wall, decreasing the light directing toward the viewer. For this reason, the distance between the polarization separator and the reflective electrode, which is as short as possible, is preferable in terms of the image quality and the efficiency for utilizing the emitted light.

In the case where a substrate is intervened between the organic light-emitting diode and the polarization separator, if the substrate is made of glass, the thickness of the substrate becomes several hundreds microns, or even if the substrate is made of a plastic film, the thickness becomes not less than several ten microns, leading to a long distance between the polarization separator and the reflective electrode. In contrast, the display device according this embodiment is configured that the light from the organic light-emitting is emitted from the reverse direction to the first substrate having the organic light-emitting diode formed thereon, and the polarization separator is stacked via the transparent, thin plate layer or insulation layer. This configuration makes it possible to decrease the distance between the polarization separator and the reflective electrode to be not more than 10 microns and, thus, the light absorbed on the dividing wall or such to be lost can be reduced to improve the efficiency for utilizing the light emitted from the emissive layer, obtaining much more bright display. In this case, since the light reflected at the polarization separator is never leaked into the reflective electrode of the different pixel to decrease the resolution or bring about blooming, the effect for obtaining high quality display can be obtained.

In the OLED display device according this embodiment, in the case where a space sealed with a gas is provided between the polarization separator 500 and the protective layer 70 formed on the transparent electrode 200, it is desirable that the sum thickness of the transparent electrode 200 and the protective layer 70 is set to be not more than quarter the wavelength of the light emitted from the emissive layer. Here, in the case where there is a layer having a thickness longer than the wavelength of the light emitted from the emissive layer, and a reflectance higher than that of nitrogen or oxygen, on the top of the transparent electrode of the organic emissive layer, a part of the light emitted from the emissive layer is wave-guided to the direction parallel to the planes of the first and second substrates with repeating the total reflection at the interface between the layer having a high reflectance and a layer having a low reflectance such as air, decreasing the light emitted to the side of the viewer.

In contrast, in the case where the sum thickness of the transparent electrode 200 and the protective layer 70 is set to be not more than quarter the wavelength of the light emitted from the emissive layer and the space sealed with a gas is provided between the polarization separator 500 and the protective layer 70 formed on the transparent electrode 200, the light emitted from the emissive layer is passed through the organic layer, the transparent electrode and the protective layer with little wave-guiding towards the direction parallel to the substrate, and then is emitted to the space 80. The light entering in the space 80, then enters in the polarization separator 500, and is passed through the polarization separator 500 and the second substrate 80 without repeating the total reflection toward the direction parallel to the substrates, and is then emitted to the side of the viewer. For this reason, much bright display can be obtained.

The arrangement of the pixels constructing the display portion of this embodiment may be any arrangement such as a stripe arrangement, a mosaic arrangement, a delta arrangement and the like, and the arrangement may be suitably selected to meet the specification of the display device. Also, whereas the display device which drives an active matrix has been described in the embodiment, the present invention is not restricted thereto. Specifically, a passive matrix driving may be applied to the display device according to the present invention in which no switching device such as TFT is provided, and the electrodes for light-emitting devices of the present invention are directly connected to vertical scanning lines and horizontal scanning lines to be driven.

Figure 14:
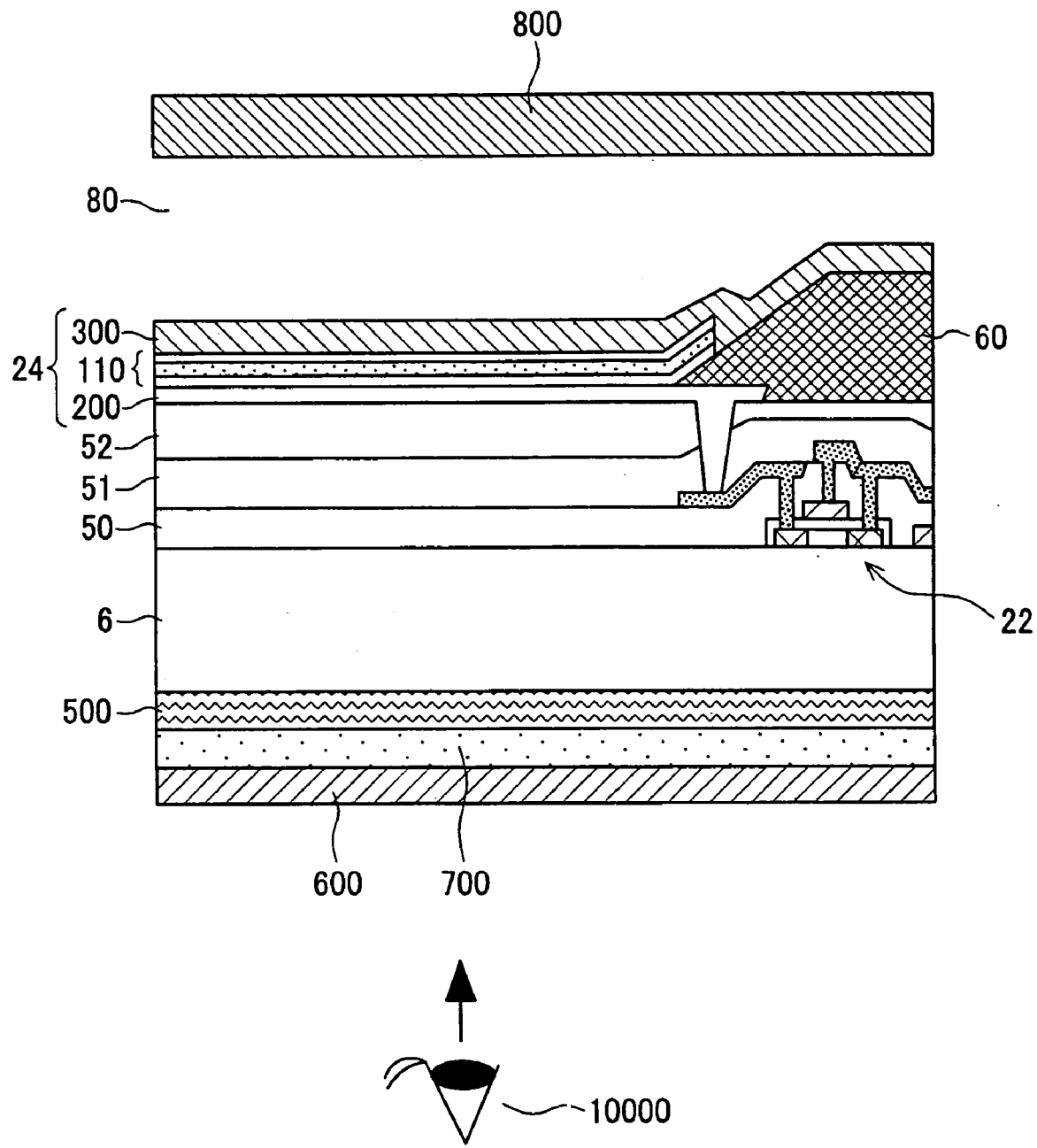
FIG. 14 is a partially cross-sectional view showing a schematic configuration of another embodiment of the OLED display device according to the present invention.

Subsequently, another embodiment of the present invention will be described. FIG. 14 is a partially cross-sectional view showing a schematic configuration of another embodiment of the OLED display device according to the present invention. This display device has a bottom-emitting structure in which the light is emitted from the substrate on which the organic light-emitting diode is formed. This display device is configured so that in the display device having a top-emitting structure having been described by referring to FIG. 10 or such, the organic light-emitting diode 24 composed of the transparent electrode 200, the organic layer 110, and the reflective electrode 300 is formed upside-down. Different from the embodiment of the top-emitting structure described above, in this embodiment, the electrode of the organic light-emitting diode 24 connected to the driving transistor 22 is the transparent electrode 200. For this reason, the construction of the circuit is sometimes changed, but since each pixel comprises the organic light-emitting diode 24, the storage capacitor (not shown), the switching transistor, and the driving transistor 22 as in the top-emitting structure, and since the basic operation is substantially the same as that of the top-emitting structure, parts having similar functions are referred to the same number and the description thereof will be omitted.

In this embodiment, the light is emitted from the side of the first substrate 6 comprising a transparent material such as glass on which the organic light-emitting diode 24 is formed. For this reason, opposite the surface on which the organic light-emitting diode 24 is formed, the polarization separator 500, the phase plate 700, and the polarizer plate 600 are placed and stacked on the first substrate 6 in this order. The surface of the first substrate 6 having the organic emissive layer formed thereon is sealed with a sealing plate 800 comprising glass, stainless steel or a resin having been subjected to gas-barrier treatment not so as to be contact with the open air. The first substrate 6 and the sealing plate 800 are sealed and adhered by applying a sealing agent having a spacer material such as beads and a rod incorporated therein to the circumference of the display portion in a frame state, and sealing nitrogen into the space 80, and optionally incorporating a desiccant.

Figure 15:
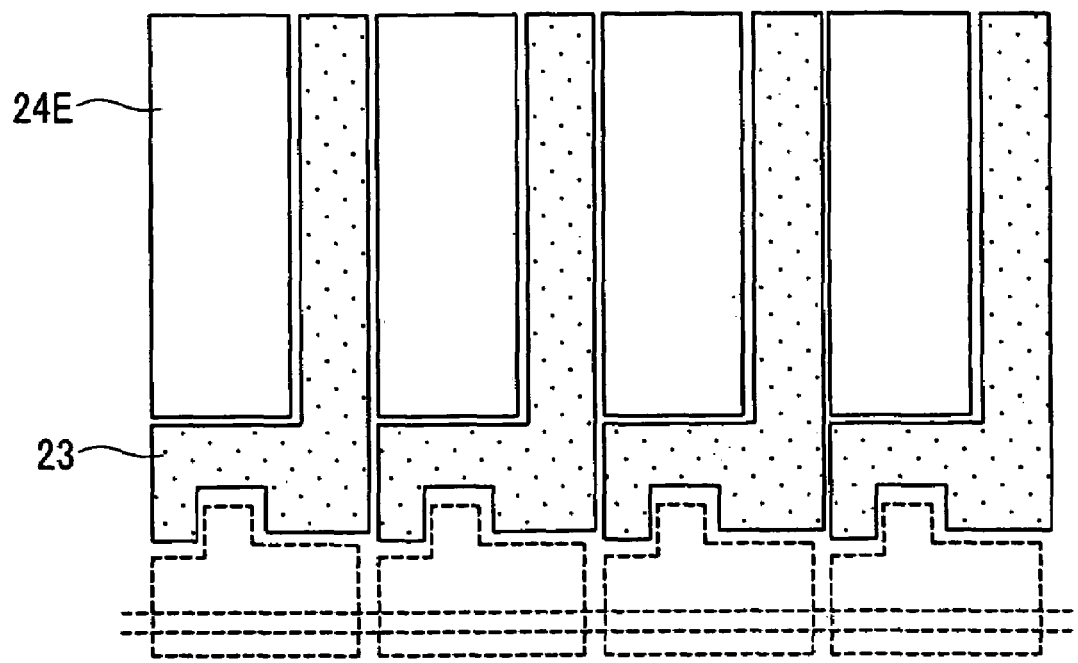
FIG. 15 is a partial plane view schematically showing the configuration of the pixel portion of the OLED display device according to another embodiment of the present invention viewing from the first substrate.

FIG. 15 is a partial plane view schematically showing the configuration of the pixel portion 20 of the OLED display device according to another embodiment of the present invention viewing from the first substrate 6. In the case of the OLED display device having a bottom-emitting structure as in this embodiment, with regard to the light emission range 24E of the organic light-emitting diode 24, the range is shared with the storage capacitor 23, switching devices such as the thin film transistor TFT, and the lines and, thus, a wide light emission range like the top-emitting structure cannot be secured as in the case of the top-emitting structure.

For this reason, when the ranges other than the light emission range 24E are configured to be no or little reflection of the light corresponding to the wavelength range reflected by the polarization separator 500, the reflection of the ambient light can be markedly decreased. Consequently, it is preferable if an anti-reflective coating (not shown) is formed on the portions other than the light emission range of the organic light-emitting diode on the first substrate. The anti-reflective film may be a film, which is free of or reduced reflection of the light corresponding to the wavelength range reflected by the polarization separator 500. In this case, the film itself or a dye or pigment contained therein may absorb the corresponding light. Alternatively, the anti-reflective film may realize no or little reflection of the light corresponding to the wavelength range reflected by the polarization separator 500 by the interference effect of the light due to transparent or translucent films each having different reflectance. Furthermore, no new film is added, and the storage capacitor 23, which occupies a relatively large range in the pixel portion 20, may be functioned as the anti-reflective film.

Figure 16:
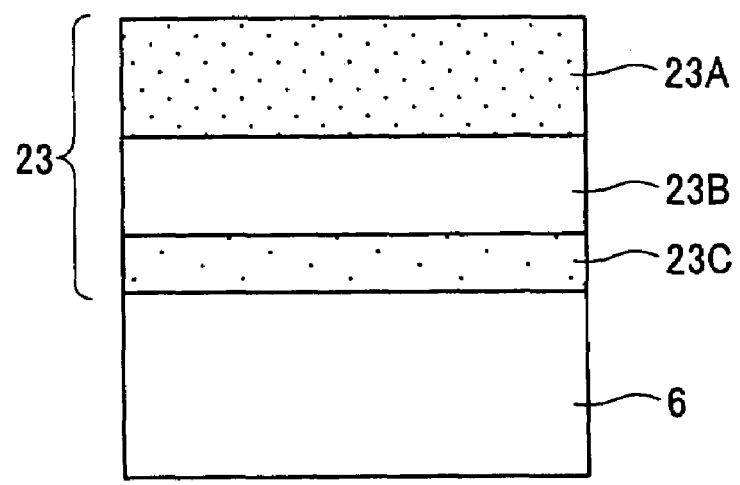
FIG. 16 is a partial cross-sectional view showing one example of the configuration of the storage capacitor in another embodiment of the OLED display device according to the present invention.

FIG. 16 is a partial cross-sectional view showing one example of the configuration of the storage capacitor 23 in another embodiment of the OLED display device according to the present invention. The storage capacitor 23 is composed of the stack, from the side of the first substrate 6, polysilicon (poly-Si) 23C, silicon oxide ($SiO_2$) 23B, and titanium—tungsten (Ti—W) 23A in this order, where the thickness of polysilicon film is 50 nm, that of silicone oxide film is 100 nm, and that of titanium-tungsten film is 150 nm. Although not being further depicted, the storage capacitor 23 is composed of the stack of $SiO_2$ and Al, but such a configuration is omitted herein.

In this case, amongst the ambient light entering in the OLED display device from the outside under a bright environment, with regard to the light entering in the light emission range 24 of the organic light-emitting diode, the light corresponding to the blue light which corresponds to the wavelength range of the reflection at the polarization separator 500 is reflected, but with regard to the light entering in the storage capacitor 23, the reflection of the light corresponding to the blue light which corresponds to the wavelength range of the reflection at the polarization separator 500 is decreased, the lights other than wavelength range of the reflection at the polarization separator 500 are not emitted out, because even if they are reflected at any portions other than the light emission range 24, they are absorbed on the polarizer plate. Consequently, the reflection of the ambient light is decreased so much as the storage capacitor 23, the contrast ratio under bright environment can be enhanced.

In order to decrease the reflect the light passed between the lines and the switching devices, the dividing wall is configured that the reflection of the light corresponding to the wavelength range reflected by the polarization separator is eliminated or reduced, even in the case of the bottom-emitting structure, the reflection of the ambient light can be remarkably decreased.

Furthermore, amongst the light emission range, in the light emission range, which emits a light having a wavelength different from the main wavelength range reflected by the polarization separator, i.e., in this embodiment, the light emission range, which emits red and green lights other than the blue light, the reflection of the light having the main wavelength range reflected by the polarization separator is preferably decreased. Specifically, the thickness of each layers making up the organic light-emitting diode is controlled to be a condition where the reflection of the light having the main wavelength range reflected by the polarization separator is decreased by the interference effect. Alternatively, color filers corresponding to respective colors, i.e., a filer which transmits the red color and absorbs the blue colors at the light emission side of the red light emission range, and a filer which transmits the blue color and absorbs the blue colors at the light emission side of the blue light emission range, are preferably provided. In this case, the reflection of the ambient light can be remarkably decreased without loosing the lights having desired colors.

Figure 17:
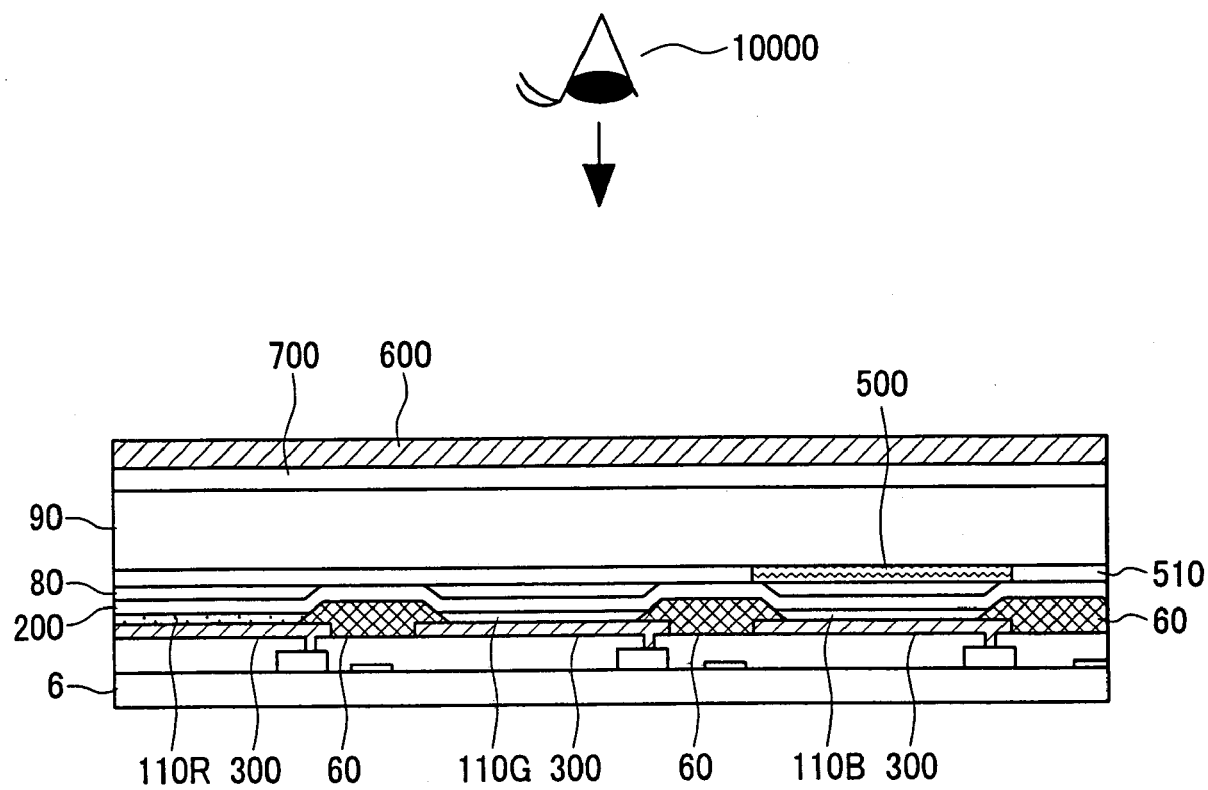
FIG. 17 is a partial cross-sectional view showing the basic configuration of the OLED display device, which displays full colors, according to another embodiment of the present invention.

Subsequently, another embodiment of the present invention will be described. FIG. 17 is a partial cross-sectional view showing the basic configuration of the OLED display device, which displays full colors, according to another embodiment of the present invention. This display device has the same basic configuration as that of the top-emitting structure having been described in the embodiment referring to FIG. 10, and FIG. 11, except that the cholesteric liquid crystal layer 500 making up the polarization separator 500 is selectively placed on the organic layer 110B for the blue light emission. The same parts as those in the aforementioned embodiment are referred to the same number, and the description thereof will be omitted.

As shown in FIG. 17, the display device according to the present invention is configured so that the cholesteric liquid crystal layer 500 making up the polarization separator 500 is selectively placed on the organic layer 110B for the blue light emission. On the surface of the second substrate where the cholesteric liquid crystal layer 500, a planarized plate 510 may be provided in order to eliminate the step formed through the selectively formed cholesteric liquid crystal layer. As the planarized layer 510, organic materials such as acrylic resins, benzo cyclobutadiene resins, polyimide resins may be utilized. The surface of the organic material can relatively easily be planarized by film-formation through a spin coater.

In this embodiment, similar to the embodiment described previously, by the action of the polarization separator, the light corresponding to the blue light, which has conventionally been absorbed on the polarizer plate to be lost can effectively utilized and, thus, the luminance of the single blue color can be improved, and the power consumed by the organic light-emitting diode when a white color is displayed can be decreased. Furthermore, by the action of the polarization separator, the OLED display device 1 according to this embodiment has an advantage that the excitation purity of the light practically emitting to the side of the viewer is improved by the light emission itself emitted from the emissive layer with regard to the blue light. For this reason, the display range of the display device is advantageously widened. Furthermore, in this embodiment, since the polarization separator is not provided on any ranges other than the light emission range of the organic light-emitting diode for the blue light, the reflection of the ambient light decreased one third or less, improving the contrast ratio under a bright condition.

Figure 18:
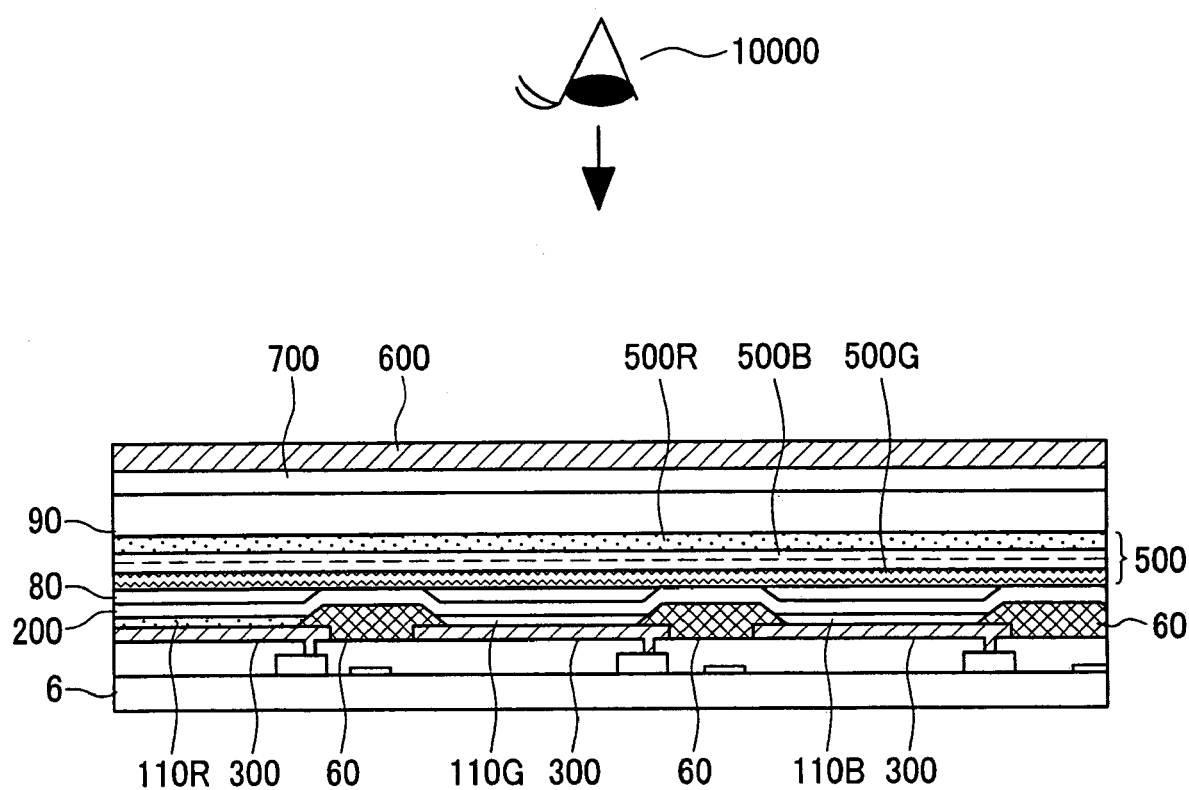
FIG. 18 is a partial cross-sectional view showing the basic configuration of the OLED display device according to another embodiment of the present invention.

Subsequently, still another embodiment of the present invention will be described. FIG. 18 is a partial cross-sectional view showing the basic configuration of the OLED display device according to another embodiment of the present invention. This display device has the same basic configuration as that of the top-emitting structure having been described in the embodiment referring to FIG. 10, and FIG.

11, except that a plurality of the cholesteric liquid crystal layers are stacked to make up the polarization separator 500. The same parts as those in the aforementioned embodiment are referred to the same number, and the description thereof will be omitted.

The polarization separator 500 is composed of a stack comprising a cholesteric liquid crystal layer 500B having a wavelength range of the main selective reflection at the wavelength corresponding to the blue and conditioned to obtain the maximum reflectance, a cholesteric liquid crystal layer 500G having a wavelength range of the main selective reflection at the wavelength corresponding to the green and conditioned not to obtain the maximum reflectance, and a cholesteric liquid crystal layer 500R having a wavelength range of the main selective reflection at the wavelength corresponding to the red and conditioned not to obtain the maximum reflectance. Specifically, the polarization separator 500 in the display device of this embodiment have a reflectance of the light corresponding to the blue, and a decreased reflectance of the lights other than blue, especially, green, which has a high relative luminous efficiency in a photopic vision.

The selective reflection of the above-mentioned cholesteric liquid crystal layer depends upon a number of helical pitches. Consequently, the number of the helical pitches in the cholesteric liquid crystal layer 500G having a wavelength range of the main selective reflection at the wavelength corresponding to the green, and in the cholesteric liquid crystal layer 500R having a wavelength range of the main selective reflection at the wavelength corresponding to the red are set to be less than 20 pitches, preferably not more than 10 pitches, to decrease the reflectance of the selective reflection. The number of the pitches can be decreased by thinning the thickness of the cholesteric liquid crystal layer.

Figure 19:
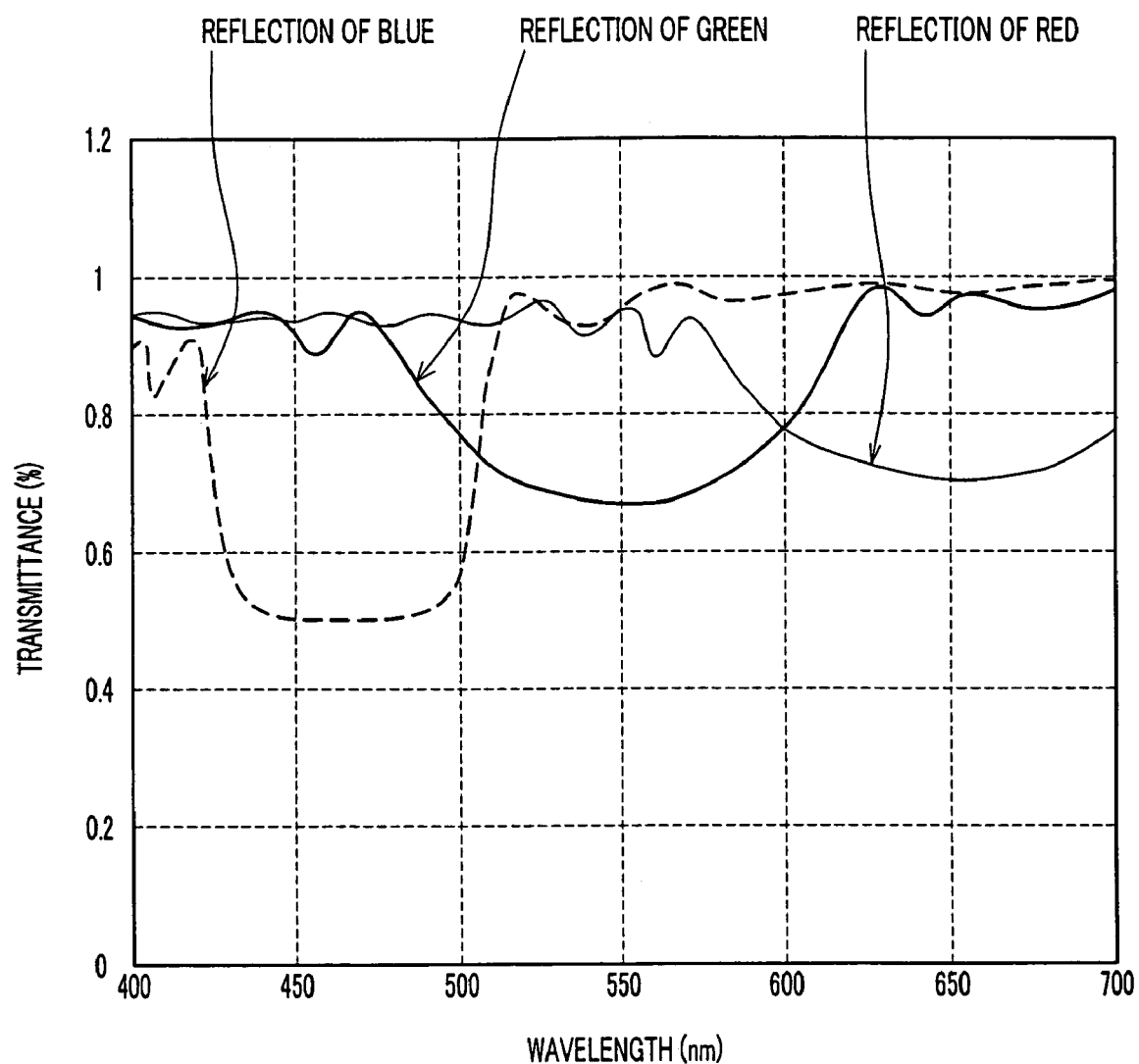
FIG. 19 is a drawing showing one example of a spectral transmittance of the cholesteric liquid crystal layer making up the polarization separator in still another embodiment of the present invention.

FIG. 19 is a drawing showing one example of a spectral transmittance of the cholesteric liquid crystal layer making up the polarization separator in still another embodiment of the present invention, and is a graph showing the wavelength-dependency of the transmittance when an un-polarized light enters in the cholesteric liquid crystal layer. In FIG. 19, the wavelength range having a low transmittance corresponds to the wavelength range of the selective reflection. In this embodiment, the light, which is absorbed on the polarizer plate, is decreased even at the wavelength having a high relative luminous efficiency and, thus, the bright display can be advantageously obtained. On the other hand, the reflection of the ambient light is somewhat increased due to the cholesteric liquid crystal layer 500G having a wavelength range of the main selective reflection at the wavelength corresponding to the green and the cholesteric liquid crystal layer 500R having a wavelength range of the main selective reflection at the wavelength corresponding to the red. However, since the reflectance of the selective reflection at the cholesteric liquid crystal layer is suppressed to be low, the reflection of the ambient light is suppressed in so much.

What is important here is that the reflection of green, which has a high relative luminous efficiency in a photopic vision, should be smaller than the reflection of blue. This decreases the reflection of the ambient light, enhancing the contrast ratio under a bright condition. In this embodiment, it is possible that the wavelength range of the selective reflection possessed by the cholesteric liquid crystal layer having a wavelength range of the main selective reflection at the wavelength corresponding to the red or blue is set to be wide to thereby obtain substantially similar selective reflection at the visible wavelength range except for the wavelength range corresponding to the blue, so that the color change viewing from a diagonal angel due to the angle-dependency of the selective reflection of the cholesteric liquid crystal layer may be suppressed. Also, in the display device of this embodiment, the order of the lamination of the cholesteric liquid crystal layer is not restricted to the order described in the figure.

Instead of the stack of a plurality of the cholesteric liquid crystal layers each having a different helical pitch, the cholesteric liquid crystal layer whose helical pitch is continuously changed may also be used. In this case, when the wavelength range obtaining the maximum reflectance of the cholesteric liquid crystal layer is set to be within the wavelength range corresponding to blue, which is of a low relative luminous efficiency in a photopic vision, specifically not less than 510 nm, more desirably not less than 490 nm, a high contrast ratio can be obtained under a bright condition.

Figure 20:
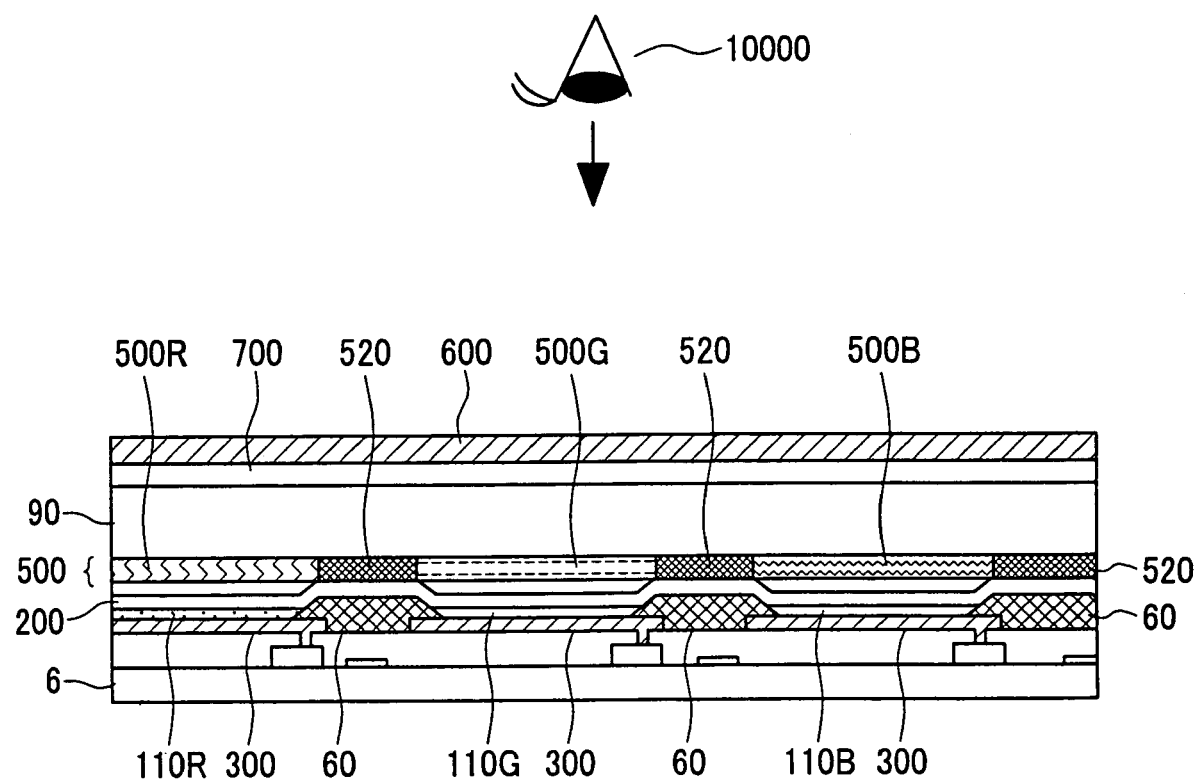
FIG. 20 is a partial cross-sectional view showing the basic configuration of the OLED display device according to still another embodiment of the present invention.

Subsequently, still another embodiment of the present invention will be described. FIG. 20 is a partial cross-sectional view showing the basic configuration of the OLED display device according to still another embodiment of the present invention. This display device has the same basic configuration as that of the top-emitting structure having been described in the embodiment referring to FIG. 10, and FIG. 11, except that the cholesteric liquid crystal layer having a plurality of patterned ranges is used as the polarization separator 500. The same parts as those in the aforementioned embodiment are referred to the same number, and the description thereof will be omitted.

The polarization separator 500 of this embodiment is configured so that a cholesteric liquid crystal layer 500B having a wavelength range of the main selective reflection at the wavelength corresponding to the blue and conditioned to obtain the maximum reflectance is placed on the organic layer 110B for the blue light emission, a cholesteric liquid crystal layer 500G having a wavelength range of the main selective reflection at the wavelength corresponding to the green and conditioned not to obtain the maximum reflectance is placed on the organic layer 110G for the green light emission, and a cholesteric liquid crystal layer 500R having a wavelength range of the main selective reflection at the wavelength corresponding to the red and conditioned not to obtain the maximum reflectance is placed on the organic layer 110R for the red light emission.

Specifically, the polarization separator 500 in the display device of this embodiment is composed of the cholesteric liquid crystal layers which are patterned to correspond to the light emission layer making up the pixel portion, and amongst the patterned cholesteric liquid crystal layers, the reflectance of the cholesteric liquid crystal layer having a wavelength range of the main selective reflection at the wavelength corresponding to the blue is set to be high, and the reflectance of the cholesteric liquid crystal layer having a wavelength range of the main selective reflection at the wavelength corresponding to the green, which has a low relative luminous efficiency in a photopic vision is set to be low. It is preferable to form a black matrix 520 between the patterned cholesteric liquid crystal layers. The black matrix 520, which can be used, includes, but are not restricted to, a black matrix comprising a photoresist resin having chromium, chromium oxide, or photo-absorbing pigment dispersed therein. In this case, in order to take a large margin for aligning the patterned cholesteric liquid crystal layer and the pixel, the opening of the black matrix is desirably larger than the light emission range.

As described above, since the selective reflection of the above-mentioned cholesteric liquid crystal layer depends upon a number of helical pitches, the number of the helical pitches in the cholesteric liquid crystal layer 500G having a wavelength range of the main selective reflection at the wavelength corresponding to the green, and in the cholesteric liquid crystal layer 500R having a wavelength range of the main selective reflection at the wavelength corresponding to the red are set to be less than 20 pitches, preferably not more than 10 pitches, to decrease the reflectance of the selective reflection. The number of the pitches can be decreased by thinning the thickness of the cholesteric liquid crystal layer.

In this embodiment, since the light absorbed on the polarizer plate even at a wavelength having a high relative luminous efficiency, bright display can advantageously be obtained. On the other hand, the reflection of the ambient light is somewhat increased due to the cholesteric liquid crystal layer 500G having a wavelength range of the main selective reflection at the wavelength corresponding to the green and the cholesteric liquid crystal layer 500R having a wavelength range of the main selective reflection at the wavelength corresponding to the red. However, since the reflectance of the selective reflection at the cholesteric liquid crystal layer is suppressed to be low, the reflection of the ambient light is suppressed in so much. Since the cholesteric liquid crystal layer is patterned in this embodiment, the reflection increased due to the cholesteric liquid crystal layer for each color is restricted to the patterned range, and the reflection area is one third or less, the reflection of the ambient light can be further suppressed.

Here, what is important is that the reflection of green, which has a high relative luminous efficiency in a photopic vision, should be smaller than the reflection of blue. This decreases the reflection of the ambient light, enhancing the contrast ratio under a bright condition.

Figure 21:
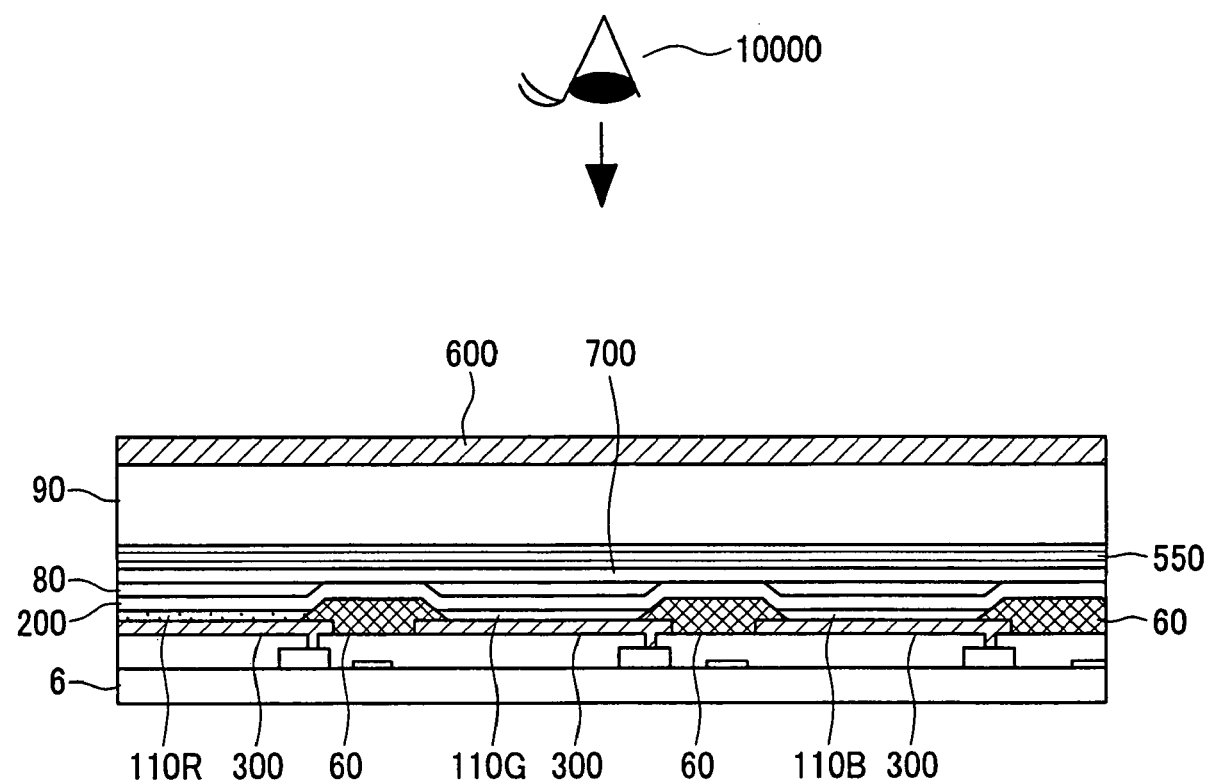
FIG. 21 is a partial cross-sectional view showing the basic configuration of the OLED display device-according to still another embodiment of the present invention.
Figure 22:
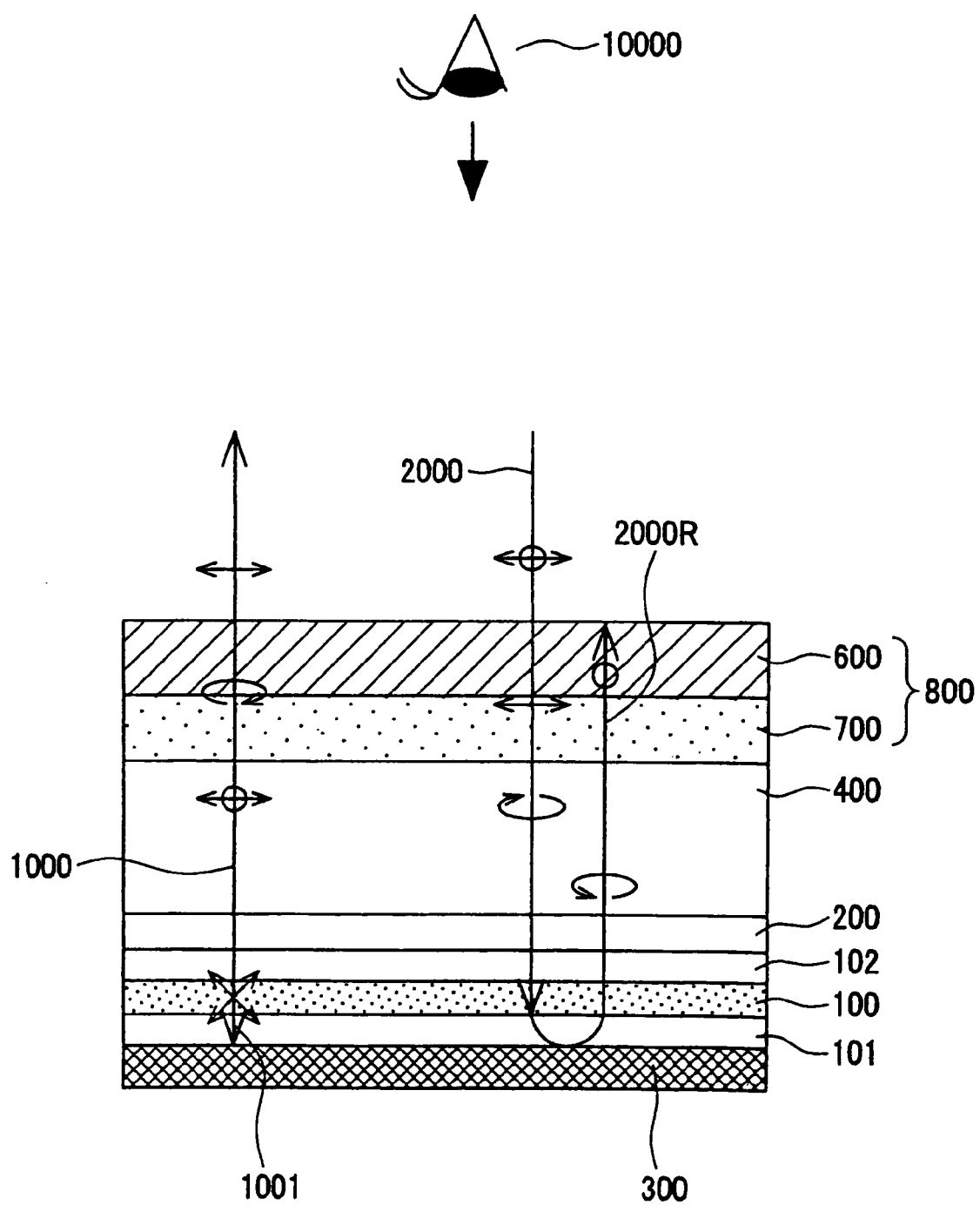
FIG. 22 is a partial cross-sectional view showing the basic configuration of the conventional OLED display device.

Subsequently, still another embodiment of the present invention will be described. FIG. 21 is a partial cross-sectional view showing the basic configuration of the OLED display device according to still another embodiment of the present invention. This display device has the same basic configuration as that of the top-emitting structure having been described in the embodiment referring to FIG. 10, and FIG. 11, except that a polarization separator (hereinafter referred to as the "linear polarization separator) 550, which reflects a linearly polarized light component having a prescribed wavelength range, and transmits other components is used as the polarization separator, and the position of the phase plate is changed. The same parts as those in the aforementioned embodiment are referred to the same number, and the description thereof will be omitted.

As shown in FIG. 21, the display device of this embodiment is configured that from the side of the transparent electrode 200, the phase plate 700, the linear polarization separator 550, and the polarizer plate 600 are placed. The linear polarization separator 550 has a function that a linearly polarized light component having a prescribed wavelength range is reflected and a light component having a wavelength range perpendicular to the former is transmitted. Various configurations of the linear polarization separator 550 may be considered. For example, a birefringent reflective polarizer film comprising different birefringent layers alternatively stacked as described in WO95/27919, which is incorporated herein by reference, and one produced by piling two prism allays whose top angle is 90 degree, and forming a polarization separating surface due to the dielectric multilayers on the stacked portion as described in SID 92 Digest (p427) can be used.

The central wavelength of the reflection at the linear polarization separator is preferably from 400 nm to 490 nm, and more preferably from 420 nm to 480 nm, and the wavelength range of the reflection is desirably not more than 510 nm. This is for the purpose of minimizing the reflection of the ambient light, and for effectively utilizing an effective light as a blue light to increase the color purity of the blue whereby the total efficiency of the display device is improved, similar to the embodiment described previously.

The phase plate 700 and the polarizer plate 600, which can be used are those which make up the circular polarizer plate in the prior art. Specifically, the polarizer plate 600 transmits a specific linearly polarized light amongst the lights passing there-through, and absorbs a linearly polarized light having a perpendicular to the former. The phase plate 700 is made up of the material serving as a quarter wave plate which converts the linearly polarized light passing through the polarizer plate 600 into a substantially circularly polarized light. While the linear polarization separator 550 is placed between the polarizer plate 600 and the phase plate 700 making up the circular polarizer plate, at this time, the linear polarization separator 550 is placed in such a manner that the transmitting axis of the linearly polarized light of the linear polarization separator 550 is accorded with the transmitting axis of the linearly polarized light of the polarizer plate 600.

Subsequently, the operation of the display device according to this embodiment will now be described. When a direct current voltage is applied between the transparent electrode 200 and the reflective electrode 300, a light with a prescribed wavelength is emitted from the emissive layer making up the organic layer. Amongst the light emitted from the emissive layer, the light directing towards the reflective electrode 200 is transmitted through the transparent electrode 200 and through the phase plate 700, and then enters in the linear polarization separator 550. On the other hand, amongst the light emitted from the emissive layer, the light directing towards the reflective electrode 300 is reflected at the reflective electrode 300, and then similarly transmitted through the transparent electrode 200 and through the phase plate 700, and then enters in the linear polarization separator 550. At this time, since the light emitted from the emissive layer and entering in the linear polarization separator 550 is an unpolarized light, the linearly polarized light component which is a light corresponding to the blue and which should be absorbed on the polarizer plate, is reflected and the light components other than the former are transmitted. Amongst the light transmitted through the liner polarization separator 550, the light corresponding to the wavelength range of the reflection at the linear polarization separator 550 is transmitted through the polarizer plate 600 and is directed towards the viewer 10000, but the lights having a wavelength other the former are absorbed half on the polarizer plate 600 and then directed towards the viewer 10000.

On the other hand, the light reflected at the linear polarization separator 550 is passed through the phase plate and is directed towards the reflective electrode 300. At the time of being passed through the phase plate 700, the light has an influence of the phase plate 700 to be a circularly polarized light. At the time of the reflection at the reflective electrode 300, the light directing towards the reflective electrode 300 becomes a circularly polarized light whose helicity direction is reverse, and at the time of being passed through the phase plate 700 again, the light has an influence of the phase plate 700 to be converted into a linearly polarized light, which is transmitted through the linear polarization separator 550. For this reason, it is transmitted through the linear polarization separator 550 and the polarizer plate 600 to be directed towards the viewer 10000.

Specifically, in the display device of this embodiment, since the light having a wavelength corresponding to the blue, amongst the light emitted from the light-emitting layer, is directed towards the viewer 10000 with little absorption on the polarizer plate, the luminance of the single color of the blue is enhanced, and the power consumed at the time of displaying white color is decreased as is the embodiment described previously. For this reason, a display device which has a high luminance and can display a bright image using the same power consumption can be realized. Alternatively, when the luminance (brightness) is the same, the current running through the organic light-emitting diode can be decreased and, thus, the power consumption can be decreased and, what is more, the display device having a long lifetime can be realized.

Subsequently, the ambient light, which enters in the display device from the circumferences under bright conditions will now be described. The ambient light entering in the display device from the circumferences is generally un-polarized. Amongst the ambient light, when being passed through the polarizer plate 600, a prescribed linearly polarized light is absorbed, and the linearly polarized light perpendicular thereto is reflected. The linearly polarized light having been transmitted through polarizer plate 600 is also transmitted through the linear polarization separator 550 and, by the action of the phase plate 700 to be a circularly polarized light. The light having been passed through the phase plate 700 becomes a circularly polarized light having a reverse helicity direction as a result at the time of being reflected at the reflective electrode 300. The light reflected at the reflective electrode 300 is converted into a linearly polarized light, which is absorbed at the reflective electrode 300 at this time, at the time of being passed through the phase plate again, and then enters in the linear polarization separator 550. At the linear polarization separator 550, the light having a wavelength corresponding to the blue is reflected, and the lights other than the former are transmitted. The lights having being transmitted through the linear polarization separator 500 is absorbed on the polarizer plate 600, and thus, they are not returned to the external display device.

On the other hand, the light reflected at the linear polarization separator 550 is converted into a circularly polarized light by the action of the phase plate 700 at the time of being passed through the phase plate 700, and at the time of reflected at the reflective electrode 300 again, it becomes a circularly polarized light having a reverse helicity direction. The light reflected at the reflective electrode 300 is converted into a linearly polarized light, which is absorbed at the reflective electrode 300 at this time, and then passed through the linearly polarization separator 550 and polarizer 600 to be directed towards the viewer 10000.

Specifically, at least half of the ambient light entering in the display device is first absorbed on the polarizer plate 600. The light having been transmitted through the polarizer plate 600 is transmitted through the linear polarization separator 550 and the phase plate 700, reflected at the reflective electrode 300, and again enters in the linear polarization separator 550. Amongst the lights just mentioned, the light transmitted through the linear polarization separator 550 is absorbed on the polarizer plate 600. Consequently, the light emitted out is just a small amount of light having a wavelength range reflected at the linear polarization separator 550. The reflected light is a light having a low relative luminous efficiency in a photopic vision, corresponding to the blue, and thus, the luminous reflectance become small. Specifically, similar to the embodiment described previously, since almost all of the ambient light is cut even under a bright environment, the black display is darken, and, thus, the display device of this embodiment has an effect that display with a high contrast ratio can be realized.

With regard to the full coloration of the OLED display device, several manners have been suggested and evidenced. For example, a manner of the combination of the blue light-emitting element with fluorescent color changing mediums (CCM) (referred to as CCM manner), a manner of the combination of a white light emission with primary color filters of red(R), green (G), and blue (B) (referred to as RGB by white manner) and the like have been suggested.

In the CCM manner, a fluorescent dye for color changing is excited with a light emitted from a blue emissive layer to convert the blue into green and red to obtain emission of primary colors. The RGB by white manner is characterized by the simplest production, because the emissive layer to be produced is only one white emissive layer. When being applied to any of the full coloration manners, the OLED display device according to the present invention can realize display with a high contrast by placing the polarizer plate, the phase plate and the polarization separator at the position between the emissive layer and the viewer.

While the embodiments of present invention have been described, the present invention is not restricted to the configurations of the embodiments and various modifications and alternations can be made without departing from the technical ideas and sprits of the present invention.

This application claims priority from Japanese Patent Application No. 2002-181239, the disclosure of which is incorporated herein by reference.

What is claimed is:

1. A light emitting device comprising a reflective element, an emissive layer, a phase plate, and a polarizer in this order, wherein
    a polarization separator, which separates light into two kinds of polarized light components, is provided between said emissive layer and said phase plate,
    said polarization separator has a reflectance of a wavelength range from 520 nm to 600 nm smaller than a reflectance of a wavelength range not more than 510 nm.

2. The light emitting device according to claim 1, wherein said polarization separator has a central wavelength of a selective reflection between 420 nm and 480 nm.

3. The light emitting device according to claim 1, wherein said polarization separator comprises a cholesteric liquid crystal layer, and said phase plate comprises a quarter wave plate, and said polarization separator, said phase plate, and a polarizer plate are provided from the side of said emissive layer in this order.

4. The light emitting device according to claim 1, which is making up plurality if of pixels placed in a matrix form and working as a display device.

5. A light emitting device comprising a reflective element, an emissive layer, a phase plate, and a polarizer in this order, wherein
    a polarization separator, which separates light into two kinds of polarized light components, is provided between said emissive layer and said phase plate,
    said polarization separator has a reflection of a light having a wavelength corresponding to blue higher than reflection of light having a wavelength other than blue.

6. The light emitting device according to claim 5, which is making up plurality of pixels placed in a matrix form and working as a display device.

7. The light emitting device according to claim 5, wherein said polarization separator has a central wavelength of a selective reflection between 420 nm and 480 nm.

8. The light emitting device according to claim 5, wherein said polarization separator comprises a cholesteric liquid crystal layer, and said phase plate comprises a quarter wave plate, and said polarization separator, said phase plate, and a polarizer plate are provided from the side of said emissive layer in this order.

9. A light emitting device comprising a reflective element, an emissive layer, a phase plate, and a polarizer in this order, wherein
   a polarization separator, which separates light into two kinds of polarized light components, is provided between said emissive layer and said phase plate,
   said polarization separator has a central wavelength of a selective reflection between 420 nm and 480 nm.

10. The light emitting device according to claim 9, which is making up plurality of pixels placed in a matrix form and working as a display device.

11. The light emitting device according to claim 9, wherein said polarization separator comprises a cholesteric liquid crystal layer, and said phase plate comprises a quarter wave plate, and said polarization separator, said phase plate, and a polarizer plate are provided from the side of said emissive layer in this order.

12. A light emitting device comprising a reflective element, an emissive layer, a phase plate, and a polarizer in this order, wherein
   a linear polarization separator, which reflects a linearly polarized light having a prescribed wavelength range, and transmits lights other than said linearly polarized light having a prescribed wavelength range, is provided between said phase plate and said polarizer,
   said phase plate comprises a quarter wave plate,
   and said linear polarization separator has a reflectance of a wavelength range from 520 nm to 600 nm smaller than a reflectance of a wavelength range not more than 510 nm.

13. The light emitting device according to claim 12, which is making up a plurality of pixels placed in a matrix form and working as a display device.

14. A light emitting device comprising a reflective element, an emissive layer, a phase plate, and a polarizer in this order, wherein
   a linear polarization separator, which reflects a linearly polarized light having a prescribed wavelength range, and transmits lights other than said linearly polarized light having a prescribed wavelength range, is provided between said phase plate and said polarizer,
   said phase plate comprises a quarter wave plate,
   and said liner polarization separator has a reflection of a light having a wavelength corresponding to a blue higher than reflection of light having a wavelength other than blue.

15. The light emitting device according to claim 14, which is making up a plurality of pixels placed in a matrix form and working as a display device.

16. A light emitting device comprising a reflective element, an emissive layer, a phase plate, and a polarizer in this order, wherein
   a linear polarization separator, which reflects a linearly polarized light having a prescribed wavelength range, and transmits lights other than said linearly polarized light having a prescribed wavelength range, is provided between said phase plate and said polarizer,
   said phase plate comprises a quarter wave plate,
   and said linear polarization separator has a central wavelength of a reflection between 420 nm and 480 nm.

17. The light emitting device according to claim 16, which is making up a plurality of pixels in a matrix form and working as a display device.

* * * * *